US011269722B2

(12) United States Patent
You et al.

(10) Patent No.: US 11,269,722 B2
(45) Date of Patent: Mar. 8, 2022

(54) APPARATUS FOR DIAGNOSING MEMORY SYSTEM AND OPERATING METHOD THEREOF

(71) Applicant: SK hynix Inc., Gyeonggi-do (KR)

(72) Inventors: Ho-Ryong You, Gyeonggi-do (KR); In-Ho Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 179 days.

(21) Appl. No.: 16/524,673

(22) Filed: Jul. 29, 2019

(65) Prior Publication Data

US 2020/0089566 A1 Mar. 19, 2020

(30) Foreign Application Priority Data

Sep. 18, 2018 (KR) .......................... 10-2018-0111535

(51) Int. Cl.
| | | |
|---|---|---|
| *G06F 11/10* | (2006.01) | |
| *G06F 11/00* | (2006.01) | |
| *G11C 29/18* | (2006.01) | |
| *G11C 11/16* | (2006.01) | |
| *G11C 29/12* | (2006.01) | |

(52) U.S. Cl.
CPC ...... *G06F 11/1048* (2013.01); *G06F 11/1016* (2013.01); *G11C 11/1673* (2013.01); *G11C 11/1675* (2013.01); *G11C 29/1201* (2013.01); *G11C 29/18* (2013.01)

(58) Field of Classification Search
CPC ............. G06F 11/1048; G06F 11/1016; G11C 11/1673; G11C 11/1675; G11C 29/00; G11C 29/04; G11C 29/10; G11C 29/18; G11C 29/44; G11C 29/1201
See application file for complete search history.

(56) References Cited

U.S. PATENT DOCUMENTS

| | | | |
|---|---|---|---|
| 6,499,119 B1 | 12/2002 | Orita et al. | |
| 7,360,112 B2* | 4/2008 | Durica | G01R 31/3187 714/5.11 |
| 9,076,530 B2* | 7/2015 | Gomez | G11C 13/0064 |
| 9,329,799 B2* | 5/2016 | Taylor | G06F 3/067 |
| 9,424,946 B2* | 8/2016 | Gomez | G11C 16/3454 |
| 2005/0198443 A1* | 9/2005 | Pai | G09G 5/39 711/147 |

FOREIGN PATENT DOCUMENTS

KR 10-1631461 6/2016

* cited by examiner

*Primary Examiner* — Justin R Knapp
(74) *Attorney, Agent, or Firm* — IP & T Group LLP

(57) ABSTRACT

An operation method is used for a memory system including at least one memory device and a controller handling an operation in the at least one memory device. The method can include performing a write operation to a first region of the at least one memory device in response to a first write command set, outputting read data through reading the first region programmed in response to the first write command set, reorganizing plural write command data regarding the first write command set, based on the read data, arranging reorganized write command data based on an index of each reorganized write command data, generating estimated read data based on arranged write command data; and comparing the read data with the estimated read data to verify an operation result of the first write command set.

18 Claims, 18 Drawing Sheets

FIG. 8A

| Write Index | Current LBA | Start LBA | End LBA | Zero/Dummy |
|---|---|---|---|---|

Write History ⟶ 22

FIG. 8B

1st Write  
LBA 0x10 ~ 0x14

| Write Index | Curr LBA | Start LBA | End LBA | Zero pattern | |
|---|---|---|---|---|---|
| 0x0 | 0x10 | 0x10 | 0x14 | 0x0 | 0x0.....⎬4KB |
| 0x0 | 0x11 | 0x10 | 0x14 | 0x0 | 0x0.....⎬4KB |
| 0x0 | 0x12 | 0x10 | 0x14 | 0x0 | 0x0.....⎬4KB |
| 0x0 | 0x13 | 0x10 | 0x14 | 0x0 | 0x0.....⎬4KB |
| 0x0 | 0x14 | 0x10 | 0x14 | 0x0 | 0x0.....⎬4KB |

2nd Write  
LBA 0x3 ~ 0x7

| Write Index | Curr LBA | Start LBA | End LBA | Zero pattern | |
|---|---|---|---|---|---|
| 0x1 | 0x3 | 0x3 | 0x7 | 0x0 | 0x0.... |
| 0x1 | 0x4 | 0x3 | 0x7 | 0x0 | 0x0.... |
| 0x1 | 0x5 | 0x3 | 0x7 | 0x0 | 0x0.... |
| 0x1 | 0x6 | 0x3 | 0x7 | 0x0 | 0x0.... |
| 0x1 | 0x7 | 0x3 | 0x7 | 0x0 | 0x0.... |

FIG. 10

| Sequence | LBA0 | LBA1 | LBA2 | LBA3 | LBA4 | LBA5 |
|---|---|---|---|---|---|---|
| 5 | F | F | F | | | |
| 6 | | G | | | | |
| 5 | F | F | F | | | |
| 4 | | E | E | E | E | |
| 4 | | E | E | E | E | |
| 0 | A | A | A | A | A | A |

↑ 38

| LBA0 | LBA1 | LBA2 | LBA3 | LBA4 | LBA5 |
|---|---|---|---|---|---|
| A | A | A | A | A | A |
| B | | | | | |
| C | | | | | |
| | D | D | | | |
| F | E | E | E | E | |
| F | F | F | | | |
| F | G | F | E | E | A |

| Sequence | LBA0 | LBA1 | LBA2 | LBA3 | LBA4 | LBA5 |
|---|---|---|---|---|---|---|
| 5 | F | F | F | | | |
| 6 | | G | | | | |
| 5 | F | F | F | | | |
| 4 | | E | E | E | E | |
| 4 | | E | E | E | E | |
| 0 | A | A | A | A | A | A |

38

↓

| Sequence | LBA0 | LBA1 | LBA2 | LBA3 | LBA4 | LBA5 |
|---|---|---|---|---|---|---|
| 0 | A | A | A | A | A | A |
| 4 | | E | E | E | E | |
| 4 | | E | E | E | E | |
| 5 | F | F | F | | | |
| 5 | F | F | F | | | |
| 6 | | G | | | | |
| Expect | F | G | F | E | E | A |

| Write Command | Index | Start LBA | End LBA |
|---|---|---|---|
| A | 0 | 0 | 5 |
| B | 1 | 0 | 0 |
| C | 2 | 0 | 0 |
| D | 3 | 1 | 2 |
| E | 4 | 1 | 4 |
| F | 5 | 0 | 2 |
| G | 6 | 1 | 1 |

⇧

| LBA0 | LBA1 | LBA2 | LBA3 | LBA4 | LBA5 |
|---|---|---|---|---|---|
| A | A | A | A | A | A |
| B | | | | | |
| C | | | | | |
| | D | D | | | |
| | E | E | ERROR | E | |
| F | F | F | | | |
| | G | | | | |
| F | G | F | A | E | A |

| Sequence | LBA0 | LBA1 | LBA2 | LBA3 | LBA4 | LBA5 |
|---|---|---|---|---|---|---|
| 5 | F | F | F | | | |
| 6 | | G | | | | |
| 5 | F | F | F | | | |
| 0 | A | A | A | A | A | A |
| 4 | | E | E | E | E | |
| 0 | A | A | A | A | A | A |

(48)

↑

| | LBA0 | LBA1 | LBA2 | LBA3 | LBA4 | LBA5 |
|---|---|---|---|---|---|---|
| | A | A | A | A | A | A |
| | B | | | | | |
| | C | | | | | |
| | | D | D | | | |
| | | E | E | ERROR | E | |
| | F | F | F | | | |
| | | G | | | | |
| | F | G | F | A | E | A |

(44)

(46)

APPARATUS FOR DIAGNOSING MEMORY SYSTEM AND OPERATING METHOD THEREOF

CROSS-REFERENCE TO RELATED APPLICATION

This patent application claims priority to Korean Patent Application No. 10-2018-0111535, filed on Sep. 18, 2018, the entire disclosure of which is incorporated herein by reference.

TECHNICAL FIELD

Various embodiments of the disclosure relate to a memory system, and more particularly, to a device for diagnosing an operation in a memory system, and a method thereof.

BACKGROUND

The computer environment paradigm has moved to ubiquitous computing systems that can support computer system access at anytime and anywhere. Due to this, use of portable electronic devices such as mobile phones, digital cameras, and notebook computers has rapidly increased. These portable electronic devices generally use a memory system having one or more memory devices for storing data. A memory system may be used as a main or an auxiliary storage device of a portable electronic device.

Unlike characteristics of a hard disk, a data storage device using a nonvolatile semiconductor memory device has advantages such as excellent stability and durability, because it has no mechanical driving part (e.g., a mechanical arm), and has high data access speed and low power consumption. As an example of a memory system having such advantages, a data storage device includes a USB (Universal Serial Bus) memory device, a memory card having various interfaces, a solid state drive (SSD) or the like.

SUMMARY

In an embodiment of the disclosure, a memory system can include at least one memory device and a controller handling an operation in the at least one memory device. An operation method for the memory system can include performing a write operation to a first region of the at least one memory device in response to a first write command set; outputting read data through reading the first region programmed in response to the first write command set; reorganizing plural write command data regarding the first write command set, based on the read data; arranging reorganized write command data based on an index of each reorganized write command data; generating estimated read data based on arranged write command data; and comparing the read data with the estimated read data to verify an operation result of the first write command set.

In another embodiment of the disclosure, a test device can be electrically coupled with at least one memory device in a memory system and engaged with, or included in, a controller handling an operation in the at least one memory device. The test device is configured to cause the memory system to perform a write operation to a first region of the at least one memory device in response to a first write command set; output read data through reading the first region programmed in response to the first write command set; reorganize plural write command data regarding the first write command set based on the read data; arrange reorganized write command data based on an index of each reorganized write command data; generate estimated read data based on arranged write command data; and compare the read data with the estimated read data to verify an operation result of the first write command set.

In another embodiment of the disclosure, a method for testing a memory device can include controlling the memory device to perform plural write operations respectively in response to plural groups of write commands, each write operation storing sequence information and storage range information in a storage region in response to a corresponding one among the plural groups; controlling the memory device to actually read data from the storage region; obtaining the sequence information and the storage range information from the actually read data; estimating read data of the storage region based on the obtained sequence information and storage range information; and determining normality of the memory device based on comparison between the estimated read data and the actually read data, wherein the sequence information represents a process sequence of a corresponding one among the plural groups, and wherein the storage range represents a storage area storing corresponding sequence information of a corresponding one among the plural groups within the storage region.

BRIEF DESCRIPTION OF THE DRAWINGS

These and other features and advantages of the invention will become apparent to those skilled in the art to which the invention pertains from the following detailed description in reference to the accompanying drawings, wherein:

FIGS. 8A and 8B are diagrams illustrating data that is stored in, or collected from, a memory device;

FIG. 10 is a diagram illustrating a method for reconstructing or reorganizing a write command set based on the read data;

FIG. 11 is a diagram illustrating a method for arranging information in a reorganization table according to an index or an order;

FIGS. 12 to 14 diagrams showing a case where a defect or an operation error occurs in the memory device.

DETAILED DESCRIPTION

Figure 1:
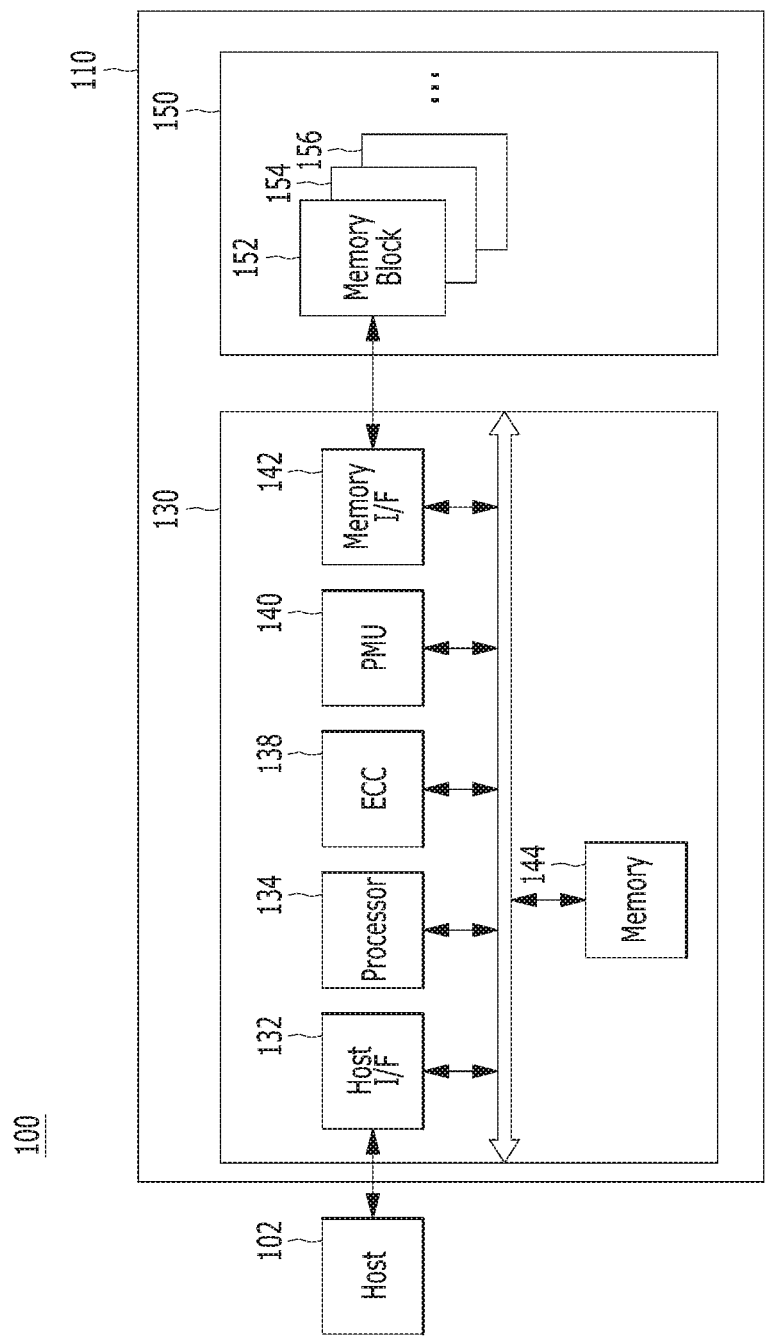
FIG. 1 is a block diagram illustrating a data processing system including a memory system in accordance with an embodiment of the invention.

Various examples of the disclosure are described below in more detail with reference to the accompanying drawings.

The disclosure may be embodied in other embodiments, forms and variations thereof and should not be construed as being limited to the embodiments set forth herein. Rather, the described embodiments are provided so that this disclosure is thorough and complete, and fully conveys the disclosure to those skilled in the art to which this invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element that otherwise have the same or similar names. Thus, a first element in one instance may be referred to as a second or third element in another instance without departing from the spirit and scope of the invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via one or more intervening elements. Communication between two elements, whether directly or indirectly connected/coupled, may be wired or wireless, unless the context indicates otherwise. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the invention.

As used herein, singular forms are intended to include the plural forms and vice versa, unless the context clearly indicates otherwise. The articles 'a' and 'an' as used in this application and the appended claims should generally be construed to mean 'one or more' unless specified otherwise or made clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the disclosure pertains in view of the present disclosure. It will be further understood that terms, such as those defined in commonly used dictionaries, should be interpreted as having a meaning that is consistent with their meaning in the context of the disclosure and the relevant art, and will not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the invention provide a memory system, a data processing system, and an operation process or a method, which can quickly and reliably process data into a memory device by reducing operational complexity and performance degradation of the memory system thereby enhancing usage efficiency of the memory device.

The disclosure provides an apparatus and a method for operating a memory system. In the apparatus and the method, a plurality of write and read commands can be queued in the memory device. Then, the read data outputted after operations are performed in response to the queued commands (Command Queuing) can be compared with write command data. A comparison result can show whether the operations can be normally performed in the memory system.

In addition, embodiments in the disclosure can determine the validity of data by generating estimated read data only based on the read data outputted from a predetermined area of the memory device, without storing a write pattern as a separate data table, to determine a validity of programmed data and an operational state of the memory device.

In an embodiment, a memory system can include at least one memory device and a controller handling an operation in the at least one memory device. An operation method for the memory system can include performing a write operation to a first region of the at least one memory device in response to a first write command set; outputting read data through reading the first region programmed in response to the first write command set; reorganizing plural write command data regarding the first write command set, based on the read data; arranging reorganized write command data based on an index of each reorganized write command data; generating estimated read data based on arranged write command data; and comparing the read data with the estimated read data to verify an operation result of the first write command set.

The operation method can include generating the first write command set for executing plural write operations.

The first write command set can include a predetermined number of write command data, each corresponding to each write operation. The write command data can include a first information item indicating an execution sequence of the write command and a second information item indicating which write command set the write command data is included in.

The read data can include plural data units, each stored in a space unit of the first region corresponding to a logical block address.

The data unit can include: a first field including the write command data; a second field including the index; a third field indicating a current reference of the read data; and a fourth field indicating a storage range of the index, the storage range being defined by information of a start location and an end location of the storage range, wherein the third field and the fourth field include one or more logical block addresses.

The first region includes plural pages, and the plural pages care located in at least one block, at least one plane, or at least one die.

The arranging can include recognizing at least some of the plural write command data and locations corresponding to the at least some write command data within the first region; and sorting the at least some of the plural write command data based on the index.

The generating can include extracting a most recent write command data from the at least some write command data for each logical block address of the first region corresponding to the operation result of the first write command set in the first region; and aligning the extracted write command data according to a sequence of the logical block address of the first region to generate the estimated read data.

The read data and the estimated read data have an identical length, and the length of the read data and the estimated read data is determined based on the number of write command data, included in the first write command set, and a size of the first region.

The length is lesser than, or equal to, the number of bits in a page, and larger than, or equal to, a value which is a binarization value of the number of write command data, included in the first write command set, multiplied by the number of logical block addresses corresponding to the first region.

The operation method is performed in an idle state of the memory system for self-diagnosis.

In another embodiment, a test device can be electrically coupled with at least one memory device in a memory system and engaged with, or included in, a controller handling an operation in the at least one memory device. The test device is configured to cause the memory system to perform a write operation to a first region of the at least one memory device in response to a first write command set; output read data through reading the first region programmed in response to the first write command set; reorganize plural write command data regarding the first write command set based on the read data; arrange reorganized write command data based on an index of each reorganized write command data; generate estimated read data based on arranged write command data; and compare the read data with the estimated read data to verify an operation result of the first write command set.

The test device is further configured to cause the memory system to generate the first write command set for executing plural write operations.

The first write command set can include a predetermined number of write command data, each corresponding to each write operation. The write command data can include a first information item indicating an execution sequence of the write command and a second information item indicating which write command set the write command data is included in.

The read data includes plural data units, each stored in a space unit of the first region corresponding to a logical block address.

The data unit can include a first field including the write command data; a second field including the index; a third field indicating a current reference of the read data; and a fourth field indicating a storage range of the index, the storage range being defined by a start location and an end location of the storage range, wherein the third field and the fourth field include one or more logical block addresses.

The first region includes plural pages, and the plural pages are located in at least one block, at least one plane, or at least one die.

The test device can be further configured to cause the memory system to recognize at least some of the plural write command data and locations corresponding to the at least some write command data within the first region; and sort the at least some of the plural write command data based on the index.

The test device can be further configured to cause the memory system to extract a most recent write command data from the at least some write command data for each logical block address of the first region corresponding to the operation result of the first write command set in the first region; and aligning the extracted write command data according to a sequence of the logical block address of the first region to generate the estimated read data.

The read data and the estimated read data have an identical length. The length of the read data and the estimated read data is determined based on the number of write command data, included in the first write command set, and a size of the first region.

In another embodiment, a method for testing a memory device can include controlling the memory device to perform plural write operations respectively in response to plural groups of write commands, each write operation storing sequence information and storage range information in a storage region in response to a corresponding one among the plural groups; controlling the memory device to actually read data from the storage region; obtaining the sequence information and the storage range information from the actually read data; estimating read data of the storage region based on the obtained sequence information and storage range information; and determining normality of the memory device based on comparison between the estimated read data and the actually read data, wherein the sequence information represents a process sequence of a corresponding one among the plural groups, and wherein the storage range represents a storage area storing corresponding sequence information of a corresponding one among the plural groups within the storage region.

Embodiments of the disclosure will be described in detail with reference to the accompanied drawings.

FIG. 1 is a block diagram illustrating a data processing system 100 including a memory system 110 in accordance with an embodiment of the invention. In FIG. 1, a data processing system 100 in accordance with an embodiment of the disclosure is described. Referring to FIG. 1, the data processing system 100 may include a host 102 engaged or interlocked with a memory system 110.

The host 102 may include, for example, a portable electronic device such as a mobile phone, an MP3 player and a laptop computer or an electronic device such as a desktop computer, a game player, a television (TV), a projector and the like.

The host 102 also includes at least one operating system (OS), which can generally manage, and control, functions and operations performed in the host 102. The OS can provide interoperability between the host 102 engaged with the memory system 110 and the user using the memory system 110. The OS may support functions and operations corresponding to user's requests. By way of example but not limitation, the OS can be classified into a general operating system and a mobile operating system according to mobility of the host 102. The general operating system may be split into a personal operating system and an enterprise operating system according to system requirements or user's environment. The personal operating system, including Windows and Chrome, may be subject to support services for general purposes. The enterprise operating systems can be specialized for securing and supporting high performance operations, and includes Windows servers, Linux, Unix and the like. Further, the mobile operating system may include an Android, an iOS, a Windows mobile and the like. The mobile operating system may be subject to support services or functions for mobility (e.g., a power saving function). The host 102 may include a plurality of operating systems. The host 102 may execute multiple operating systems interlocked with the memory system 110, corresponding to user's request. The host 102 may transmit a plurality of commands corresponding to user's requests to the memory system 110, thereby performing operations corresponding to commands within the memory system 110. Handling plural commands in the memory system 110 is described later, referring to FIGS. 4 and 5.

The memory system 110 may operate or perform a specific function or operation in response to a request from the host 102 and, particularly, may store data to be accessed by the host 102. The memory system 110 may be used as a main memory system or an auxiliary memory system of the host 102. Herein, according to an embodiment, the host 102 can include a test device, a test module or an external device for diagnosing an operation performed within the memory system 110. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, for example, a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in the various types of memory systems as exemplified above.

By way of example but not limitation, the controller 130 and the memory device 150 may be integrated into a single semiconductor device. The controller 130 and memory device 150 configuring an SSD may be integrated into a single semiconductor device, for improving an operation speed. When the memory system 110 is used as an SSD, the operating speed of the host 102 connected to the memory system 110 is improved more than that of the host 102 implemented with a hard disk. In addition, the controller 130 and the memory device 150 integrated into one semiconductor device may form a memory card. For example, a PC card (PCMCIA), a compact flash card (CF), a memory card such as a smart media card (SM, SMC), a memory sticks, a multimedia card (MMC, RS-MMC, MMCmicro), a SD card (SD, miniSD, microSD, SDHC), a universal flash memory and the like.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even when electrical power is not supplied. The memory device 150 may store data provided from the host 102 through a write operation, while providing data stored therein to the host 102 through a read operation. The memory device 150 may include a plurality of memory blocks 152, 154, 156. Each of the memory blocks 152, 154, 156 may include a plurality of pages. Each of the plurality of pages may include a plurality of memory cells to which a plurality of word lines (WL) are electrically coupled. The memory device 150 also includes a plurality of memory dies each of which includes a plurality of planes and each of the plurality of planes includes a plurality of memory blocks 152, 154, 156. In addition, the memory device 150 may be a non-volatile memory device, for example a flash memory, wherein the flash memory may be a three-dimensional stack structure.

The controller 130 may control overall operations of the memory device 150, such as read, write, program, and erase operations. For example, the controller 130 may control the memory device 150 in response to a request from the host 102. The controller 130 may provide the data, read from the memory device 150, to the host 102. The controller 130 may store the data, provided by the host 102, into the memory device 150.

The controller 130 may include a host interface (I/F) 132, a processor 134, an error correction code (ECC) circuit 138, a power management unit (PMU) 140, a memory interface (I/F) 142 and a memory 144, all operatively coupled via an internal bus.

The host interface 132 may process commands and data provided from the host 102, and may communicate with the host 102 through at least one of various interface protocols such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE). According to an embodiment, the host interface unit 132 is a component for exchanging data with the host 102, which may be implemented through firmware called a host interface layer (HIL).

The ECC circuit 138 can correct error bits of the data to be processed in (e.g., outputted from) the memory device 150, which may include an ECC encoder and an ECC decoder. Here, the ECC encoder can perform error correction encoding of data to be programmed in the memory device 150 to generate encoded data into which a parity bit is added and store the encoded data in memory device 150. The ECC decoder can detect and correct errors contained in a data read from the memory device 150 when the controller 130 reads the data stored in the memory device 150. That is, after performing error correction decoding on the data read from the memory device 150, the ECC circuit 138 can determine whether the error correction decoding has succeeded and output an instruction signal (e.g., a correction success signal or a correction fail signal). The ECC circuit 138 can use the parity bit which is generated during the ECC encoding process, for correcting the error bit of the read data. When the number of the error bits is greater than or equal to a threshold number of correctable error bits, the ECC circuit 138 may not correct error bits but may output an error correction fail signal indicating failure in correcting the error bits.

The ECC circuit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC circuit 138 may include all or some of circuits, modules, systems or devices for performing the error correction operation based on at least one of the above described codes.

The PMU 140 may manage an electrical power provided in the controller 130.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134 in a case when the memory device 150 is a flash memory and, in particular, when the memory device 150 is a NAND flash memory. The memory interface unit 142 can provide an interface for handling commands and data between the controller 130 and the memory device 150, for example, operations of NAND flash interface, in particular, operations between the controller 130 and the memory device 150. According to an embodiment, the memory interface unit 142 can be implemented through firmware called a Flash Interface Layer (FIL) as a component for exchanging data with the memory device 150.

The memory 144 may support operations performed by the memory system 110 and the controller 130. The memory 144 may store temporary or transactional data occurred or delivered for operations in the memory system 110 and the controller 130. The controller 130 may control the memory device 150 in response to a request from the host 102. The controller 130 may deliver data read from the memory device 150 into the host 102. The controller 130 may store data entered through the host 102 within the memory device 150. The memory 144 may be used to store data required for the controller 130 and the memory device 150 to perform operations such as read operations or program/write operations.

The memory 144 may be implemented with a volatile memory. The memory 144 may be implemented with a static random access memory (SRAM), a dynamic random access memory (DRAM) or both. Although FIG. 1 exemplifies the memory 144 disposed within the controller 130, the embodiment is not limited thereto. That is, the memory 144 may be located inside or outside the controller 130. For instance, the memory 144 may be embodied by an external volatile memory having a memory interface for transferring data and/or signals between the memory 144 and the controller 130.

The memory 144 can store data necessary for performing operations such as data writing and data reading requested by the host 102 and/or data transfer between the memory device 150 and the controller 130 for background operations such as garbage collection, and wear levelling as described above. According to an embodiment, for supporting operations in the memory system 110, the memory 144 may include a program memory, a data memory, a write buffer/cache, a read buffer/cache, a data buffer/cache, a map buffer/cache, and the like.

The processor 134 may be implemented with a microprocessor or a central processing unit (CPU). The memory system 110 may include one or more processors 134. The processor 134 may control the overall operations of the memory system 110. By way of example but not limitation, the processor 134 can control a program operation or a read operation of the memory device 150, in response to a write request or a read request entered from the host 102. According to an embodiment, the processor 134 may use or execute firmware to control the overall operations of the memory system 110. Herein, the firmware may be referred to as a flash translation layer (FTL). The FTL may perform an operation as an interface between the host 102 and the memory device 150. The host 102 may transmit requests for write and read operations to the memory device 150 through the FTL.

The FTL may manage operations of address mapping, garbage collection, wear-leveling and so forth. Particularly, the FTL may load, generate, update, or store map data. Therefore, the controller 130 may map a logical address, which is entered from the host 102, with a physical address of the memory device 150 through the map data. The memory device 150 may be a general storage device to perform a read or write operation because of the address mapping operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the previous particular page to the another newly programed page) due to a characteristic of a flash memory device. Further, the controller 130 may store map data of the new data into the FTL.

For example, for performing an operation requested from the host 102 in the memory device 150, the controller 130 uses the processor 134 implemented in a microprocessor or central processing unit (CPU) or the like. The processor 134 engaged with the memory device 150 can handle instructions or commands corresponding to an inputted command from the host 102. The controller 130 can perform a foreground operation as a command operation, corresponding to an command inputted from the host 102, such as a program operation corresponding to a write command, a read operation corresponding to a read command, an erase/discard operation corresponding to an erase/discard command and a parameter set operation corresponding to a set parameter command or a set feature command with a set command.

For another example, the controller 130 may perform a background operation on the memory device 150 through the processor 134. By way of example but not limitation, the background operation for the memory device 150 includes an operation (e.g., a garbage collection (GC) operation) for copying and storing data stored in an arbitrary memory block among the memory blocks 152, 154, 156 in the memory device 150 to another arbitrary memory block. The background operation can include an operation (e.g., a wear leveling (WL) operation) to move or swap between data stored in at least one of the memory blocks 152, 154, 156 in memory device 150 and in at least another of the memory blocks 152, 154, 156. As the background operation, the controller 130 uses the processor 134 for storing the map data stored in the controller 130 to at least one of the memory blocks 152, 154, 156 in the memory device 150, e.g., a map flush operation. A bad block management operation for checking bad blocks in the plurality of memory blocks 152, 154, 156 included in the memory device 150 is one of other background operation examples performed by the processor 134.

In the memory system 110, the controller 130 performs a plurality of command operations corresponding to a plurality of commands entered from the host 102. For example, when performing a plurality of program operations corresponding to plural program commands, a plurality of read operations corresponding to plural read commands and a plurality of erase operations corresponding to plural erase commands sequentially, randomly or alternatively, the controller 130 can determine which channel(s) or way(s) in a plurality of channels (or ways) for connecting the controller 130 to a plurality of memory dies included in the memory 150 is/are proper or appropriate for performing each operation. The controller 130 can send or transmit data or instructions via determined channels or ways for performing each operation. The plurality of memory dies included in the memory 150 can transmit an operation result via the same channels or ways, respectively, after each operation is complete. Then, the controller 130 may transmit a response or an acknowledge signal to the host 102. In an embodiment, the controller 130 can check a status of each channel or each way. In response to a command entered from the host 102, the controller 130 may select at least one channel or way based on the status of each channel or each way so that instructions and/or operation results with data may be delivered via selected channel(s) or way(s).

By way of example but not limitation, the controller 130 can recognize statuses regarding a plurality of channels (or ways) associated with a plurality of memory dies included in the memory device 150. The controller 130 may determine each channel or each way as one of a busy state, a ready state, an active state, an idle state, a normal state and/or an abnormal state. Controller's determination of which channel or way an instruction (and/or a data) is delivered through can be associated with a physical block address, e.g., which die(s) the instruction (and/or the data) is delivered into. The controller 130 can refer to descriptors delivered from the memory device 150. The descriptors can include a block or page of parameters that describe something about the memory device 150, which is a data with a predetermined format or structure. For instance, the descriptors may include device descriptors, configuration descriptors, unit descriptors, and the like. The controller 130 can refer to, or use, the descriptors to determine which channel(s) or way(s) an instruction or a data is exchanged via.

A management unit (not shown) may be included in the processor 134. The management unit may perform bad block management of the memory device 150. The management unit may find bad memory blocks included in the memory device 150, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 110. Thus, reliable bad block management may enhance or improve performance of the memory system 110.

Figure 2:
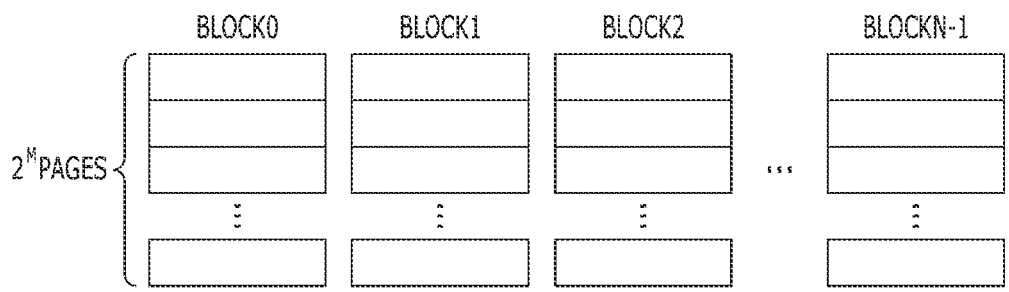
FIG. 2 is a diagram illustrating an exemplary configuration of a memory device employed in the memory system shown in FIG. 1.

FIG. 2 is a schematic diagram illustrating the memory device 150.

Referring to FIG. 2, the memory device 150 may include a plurality of memory blocks 0 to N−1, and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, or a multi-level cell (MLC) storing 2- or more bit data. In an embodiment, the memory device 150 may include a plurality of triple level cells (TLC) each storing 3-bit data. In another embodiment, the memory device may include a plurality of quadruple level cells (QLC) each storing 4-bit data.

Figure 3:
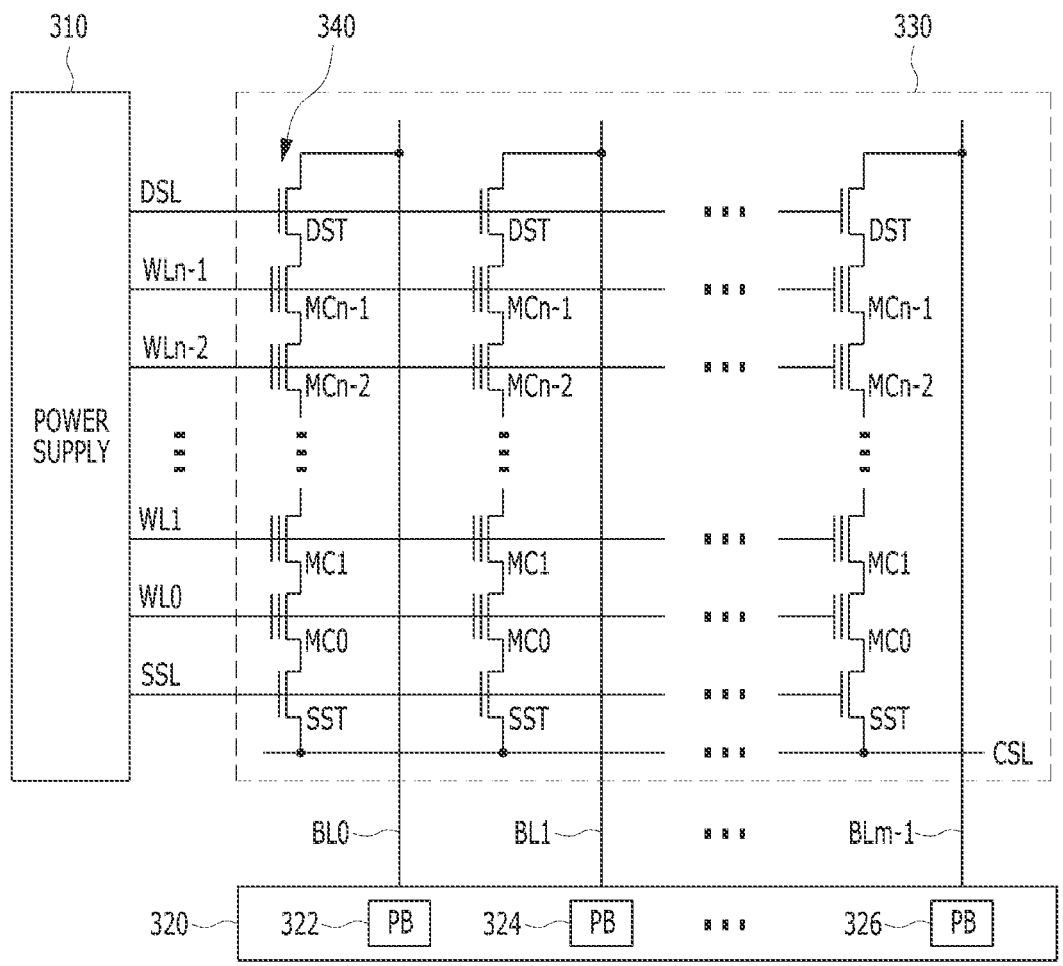
FIG. 3 is a diagram illustrating an exemplary configuration of a memory cell array of a memory block in the memory device shown in FIG. 2.

FIG. 3 is a circuit diagram illustrating an exemplary configuration of a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST, SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage, and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and may supply a current or a voltage onto bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches (not illustrated).

Figure 4:
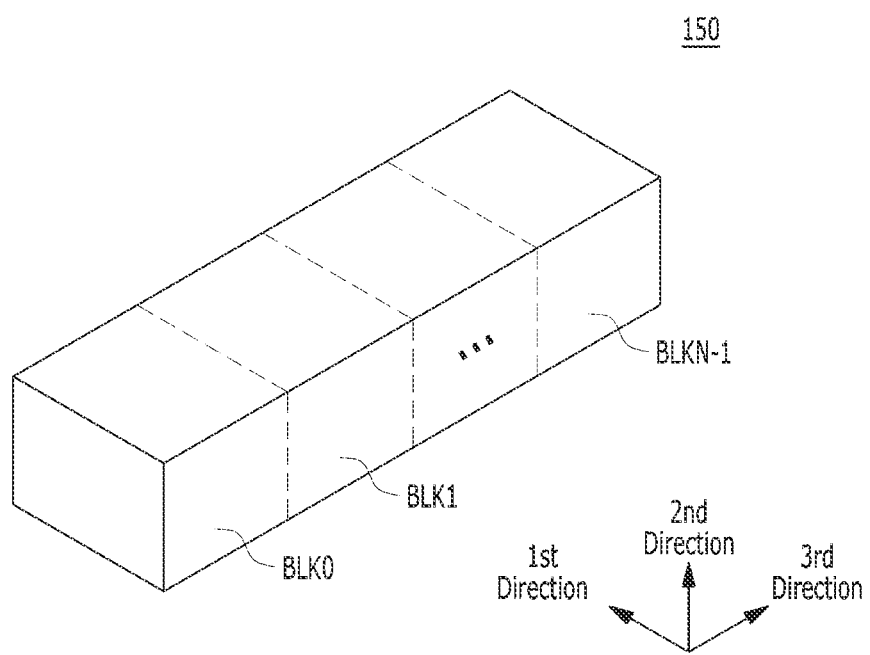
FIG. 4 is a diagram showing an exemplary three-dimensional structure of the memory device shown in FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

Figure 5:
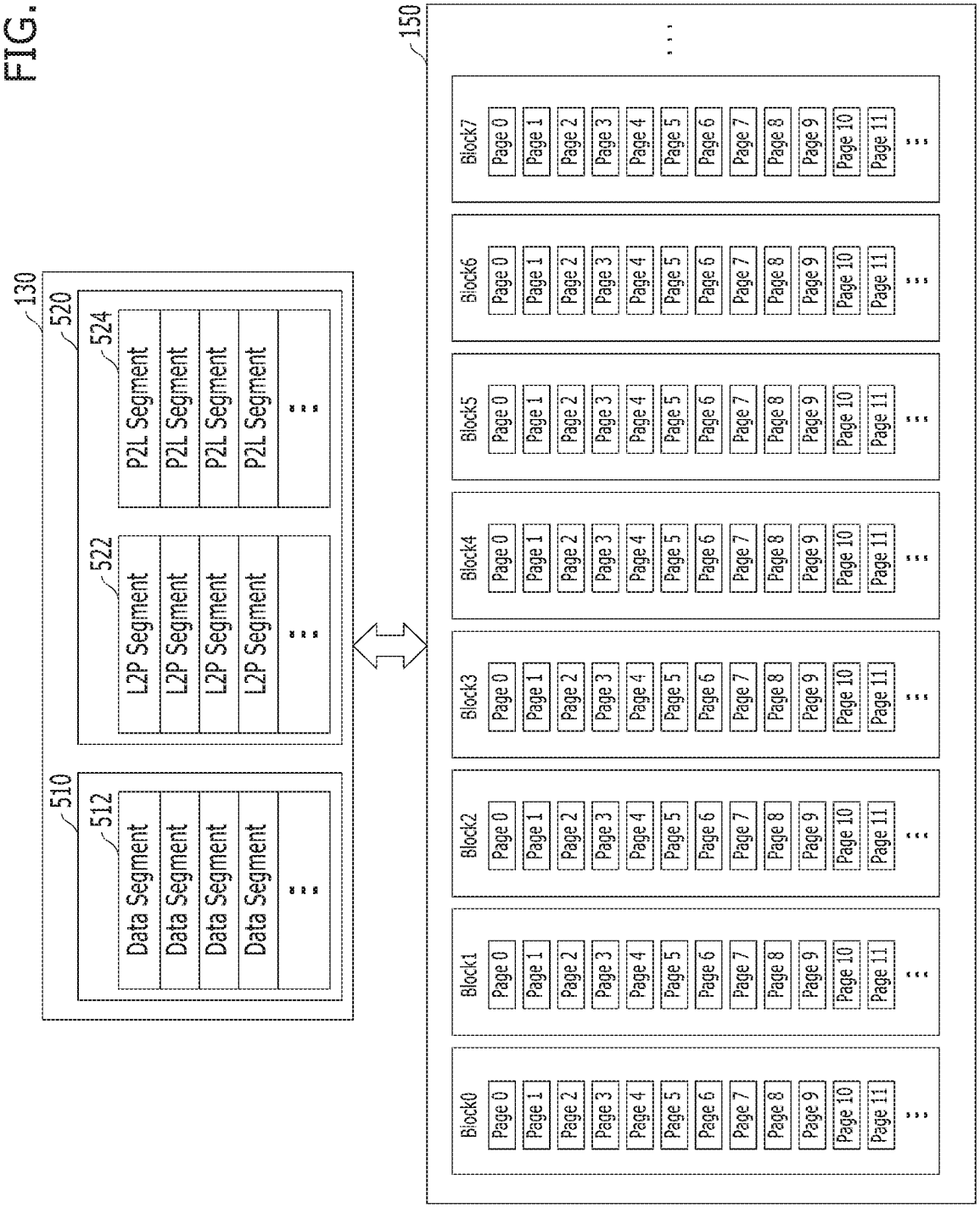
FIGS. 5 and 6 are diagrams illustrating a memory system according to another embodiment of the disclosure.
Figure 6:
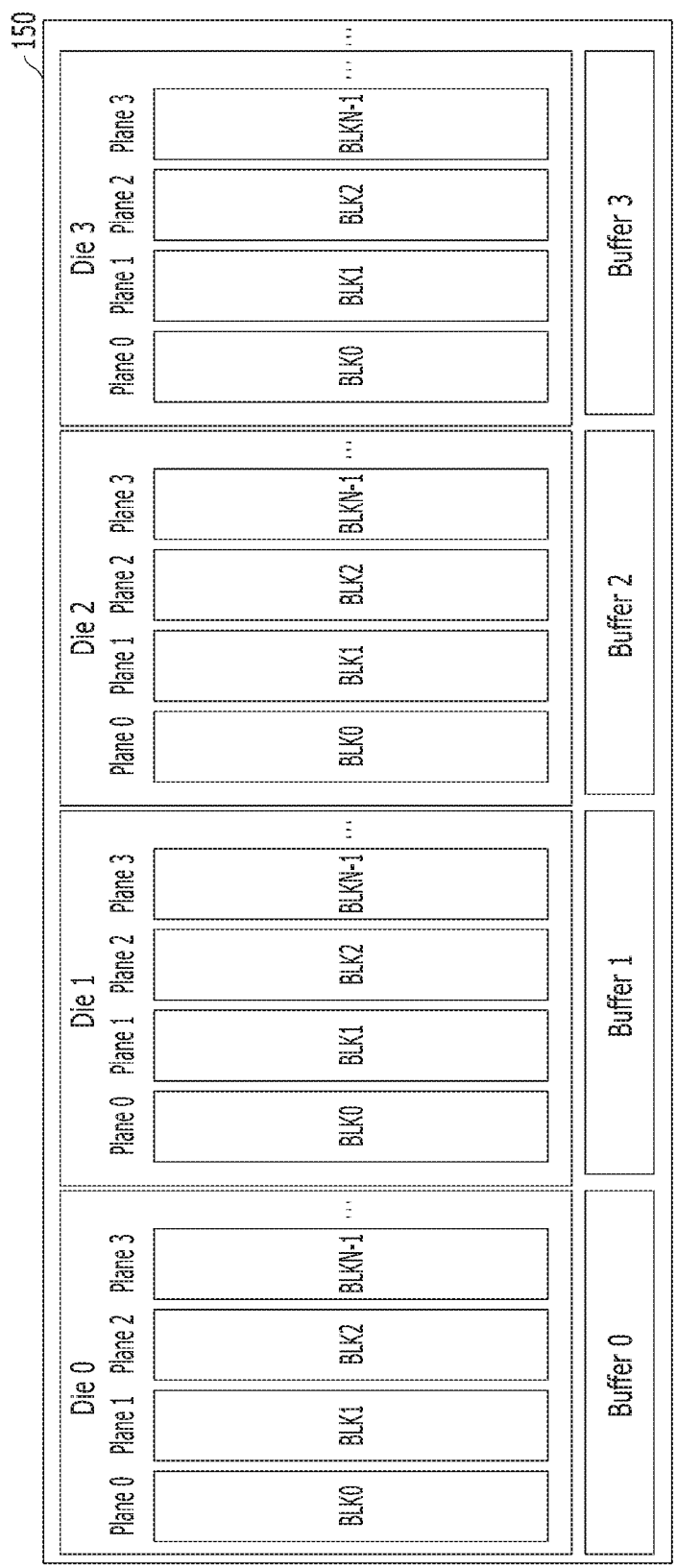

FIGS. 5 and 6 schematically describe an example of performing a plurality of command operations corresponding to a plurality of commands in the memory system according to an embodiment of the disclosure. For example, in the embodiment of the disclosure, detailed descriptions will be made for a data processing operation in a case where a plurality of write commands are received from the host 102 and program operations corresponding to the write commands are performed, in another case where a plurality of read commands are received from the host 102 and read operations corresponding to the read commands are performed, in another case where a plurality of erase commands are received from the host 102 and erase operations corresponding to the erase commands are performed, or in another case where a plurality of write commands and a plurality of read commands are received together from the host 102 and program operations and read operations corresponding to the write commands and the read commands are performed.

Moreover, in the embodiment of the disclosure, descriptions will be made by taking as an example a case where: write data corresponding to a plurality of write commands entered from the host 102 are stored in the buffer/cache included in the memory 144 of the controller 130, the write data stored in the buffer/cache are programmed to and stored in the plurality of memory blocks included in the memory device 150, map data corresponding to the stored write data in the plurality of memory blocks, are updated. The updated map data are stored in the plurality of memory blocks included in the memory device 150. In the embodiment of the disclosure, descriptions will be made by taking as an example a case where program operations corresponding to a plurality of write commands entered from the host 102 are performed. Furthermore, in the embodiment of the disclosure, descriptions will be made by taking as an example a case where: a plurality of read commands are entered from the host 102 for the data stored in the memory device 150, data corresponding to the read commands are read from the memory device 150 by checking the map data of the data corresponding to the read commands, the read data are stored in the buffer/cache included in the memory 144 of the controller 130, and the data stored in the buffer/cache are provided to the host 102. That is, in the embodiment of the disclosure, descriptions will be made by taking as an example a case where read operations corresponding to a plurality of read commands entered from the host 102, are performed. In addition, in the embodiment of the disclosure, descriptions will be made by taking as an example a case where a plurality of erase commands are received from the host 102 for the memory blocks included in the memory device 150, memory blocks are checked corresponding to the erase commands, the data stored in the checked memory blocks are erased, map data corresponding to the erased data, are updated, and the updated map data are stored in the plurality of memory blocks included in the memory device 150. Namely, in the embodiment of the disclosure, descriptions will be made by taking as an example a case where erase operations corresponding to a plurality of erase commands received from the host 102 are performed.

Further, while, in the embodiment of the disclosure, it will be described below as an example that the controller 130 performs command operations in the memory system 110. However, it is to be noted that, as described above, the processor 134 included in the controller 130 may perform command operations in the memory system 110, through, for example, an FTL (flash translation layer). Also, in the embodiment of the disclosure, the controller 130 programs and stores user data and metadata corresponding to write commands entered from the host 102, in arbitrary memory blocks among the plurality of memory blocks included in the memory device 150, reads user data and metadata corresponding to read commands received from the host 102, from arbitrary memory blocks among the plurality of memory blocks included in the memory device 150, and provides the read data to the host 102, or erases user data and metadata, corresponding to erase commands entered from the host 102, from arbitrary memory blocks among the plurality of memory blocks included in the memory device 150.

Metadata may include first map data including a logical/physical (L2P: logical to physical) information (hereinafter, referred to as a 'logical information') and second map data including a physical/logical (P2L: physical to logical) information (hereinafter, referred to as a 'physical information'), for data stored in memory blocks corresponding to a program operation. Also, the metadata may include information on command data corresponding to a command received from the host 102, information on a command operation corresponding to the command, information on the memory blocks of the memory device 150 for which the command operation is to be performed, and information on map data corresponding to the command operation. That is, metadata may include all remaining information and data excluding user data corresponding to a command received from the host 102.

In an embodiment of the disclosure, in the case where the controller 130 receives a plurality of write commands from the host 102, program operations corresponding to the write commands are performed, and user data corresponding to the write commands are written and stored in empty memory blocks, open memory blocks, or free memory blocks for which an erase operation has been performed, among the memory blocks of the memory device 150. Also, first map data, including an L2P map table or an L2P map list in which logical information as the mapping information between logical addresses and physical addresses for the user data stored in the memory blocks are recorded, and second map data, including a P2L map table or a P2L map list in which physical information as the mapping information between physical addresses and logical addresses for the memory blocks stored with the user data are recorded, are written and stored in empty memory blocks, open memory blocks, or free memory blocks among the memory blocks of the memory device 150.

Here, in the case where write commands are entered from the host 102, the controller 130 writes and stores user data corresponding to the write commands in memory blocks. The controller 130 stores, in other memory blocks, metadata including first map data and second map data for the user data stored in the memory blocks. Particularly, corresponding to the data segments of the user data which are stored in the memory blocks of the memory device 150, the controller 130 generates and updates the L2P segments of first map data and the P2L segments of second map data as the map segments of map data among the meta segments of metadata. The controller 130 stores the map segments in the memory blocks of the memory device 150. The map segments stored in the memory blocks of the memory device 150 are loaded in the memory 144 included in the controller 130 and are then updated.

Further, in the case where a plurality of read commands are received from the host 102, the controller 130 reads read data corresponding to the read commands, from the memory device 150, stores the read data in the buffers/caches included in the memory 144 of the controller 130. The controller 130 provides the data stored in the buffers/caches, to the host 102, by which read operations corresponding to the plurality of read commands are performed.

In addition, in the case where a plurality of erase commands are received from the host 102, the controller 130 checks memory blocks of the memory device 150 corresponding to the erase commands, and then, performs erase operations for the memory blocks.

When command operations corresponding to the plurality of commands received from the host 102 are performed while a background operation is performed, the controller 130 loads and stores data corresponding to the background operation, that is, metadata and user data, in the buffer/cache included in the memory 144 of the controller 130, and then stores the data, that is, the metadata and the user data, in the memory device 150. Herein, by way of example but not limitation, the background operation may include a garbage collection operation or a read reclaim operation as a copy operation, a wear leveling operation as a swap operation or a map flush operation, For instance, for the background operation, the controller 130 may check metadata and user data corresponding to the background operation, in the memory blocks of the memory device 150, load and store the metadata and user data stored in certain memory blocks of the memory device 150, in the buffer/cache included in the memory 144 of the controller 130, then store the metadata and user data, in certain other memory blocks of the memory device 150.

In the memory system in accordance with the embodiment of the disclosure, in the case of performing command operations as foreground operations and a copy operation, a swap operation and a map flush operation as background operations, the controller 130 schedules queues corresponding to the foreground operations and the background operations and allocates the scheduled queues to the memory 144 included in the controller 130 and the memory included in the host 102. In this regard, the controller 130 assigns identifiers (IDs) by respective operations for the foreground operations and the background operations to be performed in the memory device 150, and schedules queues corresponding to the operations assigned with the identifiers, respectively. In the memory system in accordance with the embodiment of the disclosure, identifiers are assigned not only by respective operations for the memory device 150 but also by functions for the memory device 150, and queues corresponding to the functions assigned with respective identifiers are scheduled.

In the memory system in accordance with the embodiment of the disclosure, the controller 130 manages the queues scheduled by the identifiers of respective functions and operations to be performed in the memory device 150. The controller 130 manages the queues scheduled by the identifiers of a foreground operation and a background operation to be performed in the memory device 150. In the memory system in accordance with the embodiment of the disclosure, after memory regions corresponding to the queues scheduled by identifiers are allocated to the memory 144 included in the controller 130 and the memory included in the host 102, the controller 130 manages addresses for the allocated memory regions. The controller 130 performs not only the foreground operation and the background operation but also respective functions and operations in the memory device 150, by using the scheduled queues.

Referring to FIG. 5, the controller 130 performs command operations corresponding to a plurality of commands entered from the host 102, for example, program operations corresponding to a plurality of write commands entered from the host 102. At this time, the controller 130 programs and stores user data corresponding to the write commands, in memory blocks of the memory device 150. Also, corresponding to the program operations with respect to the memory blocks, the controller 130 generates and updates metadata for the user data and stores the metadata in the memory blocks of the memory device 150.

The controller 130 generates and updates first map data and second map data which include information indicating that the user data are stored in pages included in the memory blocks of the memory device 150. That is, the controller 130 generates and updates L2P segments as the logical segments of the first map data and P2L segments as the physical segments of the second map data, then stores the L2P segments and the P2L segments in pages included in the memory blocks of the memory device 150.

For example, the controller 130 caches and buffers the user data corresponding to the write commands entered from the host 102, in a first buffer 510 included in the memory 144 of the controller 130. Particularly, after storing data segments 512 of the user data in the first buffer 510 worked as a data buffer/cache, the controller 130 stores the data segments 512 stored in the first buffer 510 in pages included in the memory blocks of the memory device 150. As the data segments 512 of the user data corresponding to the write commands received from the host 102 are programmed to and stored in the pages included in the memory blocks of the memory device 150, the controller 130 generates and updates the first map data and the second map data. The controller 130 stores the L2P segments and the P2L segments in a second buffer 520 included in the memory 144 of the controller 130. Particularly, the controller 130 stores L2P segments 522 of the first map data and P2L segments 524 of the second map data for the user data, in the second buffer 520 as a map buffer/cache. As described above, the L2P segments 522 of the first map data and the P2L segments 524 of the second map data may be stored in the second buffer 520 of the memory 144 in the controller 130. A map list for the L2P segments 522 of the first map data and another map list for the P2L segments 524 of the second map data may be stored in the second buffer 520. The controller 130 stores the L2P segments 522 of the first map data and the P2L segments 524 of the second map data, which are stored in the second buffer 520, in pages included in the memory blocks of the memory device 150.

Also, the controller 130 performs command operations corresponding to a plurality of commands received from the host 102, for example, read operations corresponding to a plurality of read commands received from the host 102. Particularly, the controller 130 loads L2P segments 522 of first map data and P2L segments 524 of second map data as the map segments of user data corresponding to the read commands, in the second buffer 520, and checks the L2P segments 522 and the P2L segments 524. Then, the controller 130 reads the user data stored in pages of corresponding memory blocks among the memory blocks of the memory device 150, stores data segments 512 of the read user data in the first buffer 510, and then provides the data segments 512 to the host 102.

Furthermore, the controller 130 performs command operations corresponding to a plurality of commands entered from the host 102, for example, erase operations corresponding to a plurality of erase commands entered from the host 102. In particular, the controller 130 checks memory blocks corresponding to the erase commands among the memory blocks of the memory device 150 to carry out the erase operations for the checked memory blocks.

In the case of performing an operation of copying data or swapping data among the memory blocks included in the memory device 150, for example, a garbage collection operation, a read reclaim operation, or a wear leveling operation, as a background operation, the controller 130 stores data segments 512 of corresponding user data, in the first buffer 510, loads map segments 522, 524 of map data corresponding to the user data, in the second buffer 520, and then performs the garbage collection operation, the read reclaim operation, or the wear leveling operation. In the case of performing a map update operation and a map flush operation for metadata, e.g., map data, for the memory blocks of the memory device 150 as a background operation, the controller 130 loads the corresponding map segments 522, 524 in the second buffer 520, and then performs the map update operation and the map flush operation.

As aforementioned, in the case of performing functions and operations including a foreground operation and a background operation for the memory device 150, the controller 130 assigns identifiers by the functions and operations to be performed for the memory device 150. The controller 130 schedules queues respectively corresponding to the functions and operations assigned with the identifiers. The controller 130 allocates memory regions corresponding to the respective queues, to the memory 144 included in the controller 130 and the memory included in the host 102. The controller 130 manages the identifiers assigned to the respective functions and operations, the queues scheduled for the respective identifiers and the memory regions allocated to the memory 144 of the controller 130, and the memory of the host 102 corresponding to the queues. The controller 130 performs the functions and operations for the memory device 150, through the memory regions allocated to the memory 144 of the controller 130 and the memory of the host 102.

Referring to FIG. 6, the memory device 150 includes a plurality of memory dies, for example, a memory die 0, a memory die 1, a memory die 2 and a memory die 3. Each of the memory dies includes a plurality of planes, for example, a plane 0, a plane 1, a plane 2 and a plane 3. The respective planes in the memory dies included in the memory device 150 include a plurality of memory blocks, for example, N number of blocks Block0, Block1, . . . , BlockN−1 each including a plurality of pages, for example, 2 M number of pages. Moreover, the memory device 150 includes a plurality of buffers corresponding to the respective memory dies, for example, a buffer 0 corresponding to the memory die 0, a buffer 1 corresponding to the memory die 1, a buffer 2 corresponding to the memory die 2 and a buffer 3 corresponding to the memory die 3.

When performing command operations corresponding to a plurality of commands received from the host 102, data corresponding to the command operations are stored in the buffers included in the memory device 150. For example, when performing program operations, data corresponding to the program operations are stored in the buffers, and are then stored in the pages included in the memory blocks of the memory dies. When performing read operations, data corresponding to the read operations are read from the pages included in the memory blocks of the memory dies, then are stored in the buffers, and provided to the host 102 through the controller 130.

In the embodiment of the disclosure, while it will be described below as an example that the buffers included in the memory device 150 exist outside the respective corresponding memory dies, it is to be noted that the buffers may exist inside the respective corresponding memory dies, and it is to be noted that the buffers may correspond to the respective planes or the respective memory blocks in the respective memory dies. Further, in the embodiment of the disclosure, while it will be described below as an example that the buffers included in the memory device 150 are the plurality of page buffers 322, 324 and 326 included in the memory device 150 as described above with reference to FIG. 3, it is to be noted that the buffers may be a plurality of caches or a plurality of registers included in the memory device 150.

Also, the plurality of memory blocks included in the memory device 150 may be grouped into a plurality of super memory blocks, and command operations may be performed in the plurality of super memory blocks. Each of the super memory blocks may include a plurality of memory blocks, for example, memory blocks included in a first memory block group and a second memory block group. In this regard, when the first memory block group is included in the first plane of a certain first memory die, the second memory block group may be included in the first plane of the first memory die, be included in the second plane of the first memory die, or be included in the planes of a second memory die.

In an embodiment of the disclosure, a data processing system may include plural memory systems. Each of the plural memory systems 110 can include the controller 130 and the memory device 150. In the data processing system, one of the plural memory systems 110 can be a master and the others can be a slave. The master may be determined based on contention between the plural memory systems 110. When a plurality of commands is delivered from the host 102 in the data processing system, the master can determine a destination of each command based at least on statuses of channels or buses. For example, a first memory system can be determined as a master memory system, i.e., the master, among a plurality of memory systems, corresponding to information delivered from the plurality of memory systems. If the first memory system is determined as the master memory system, the remaining memory systems are considered slave memory systems, i.e., the slave. A controller of the master memory system can check statuses of a plurality of channels (or ways, buses) coupled to a plurality of memory systems, to select which memory system handles commands or data delivered from the host 102. In an embodiment, a master can be dynamically determined among the plural memory systems. In another embodiment, a master memory system may be changed as one of the other slave memory systems periodically or according to an event.

Hereinafter, a method and apparatus for transferring data in the memory system 110 including the memory system 150 and the controller 130 described above will be described in more detail. When the amount of data stored in the memory system 110 becomes larger, and the memory system 110 may be required to read or store large amounts of data at a time. However, a read time for reading a data stored in the memory device 150 or a program/write time for writing a data in the memory device 150 may be generally longer than a handling time for the controller 130 to process a data or a data transmission time between the controller 130 and the memory device 150. For example, the read time might be twice of the handling time. Since the read time or the program time is relatively far longer than the handling time or the data transmission time, a procedure or a process for delivering data in the memory system 110 may affect performance of the memory system 110, e.g., an operation speed, and/or structure of the memory system 110 such as a buffer size.

Figure 7:
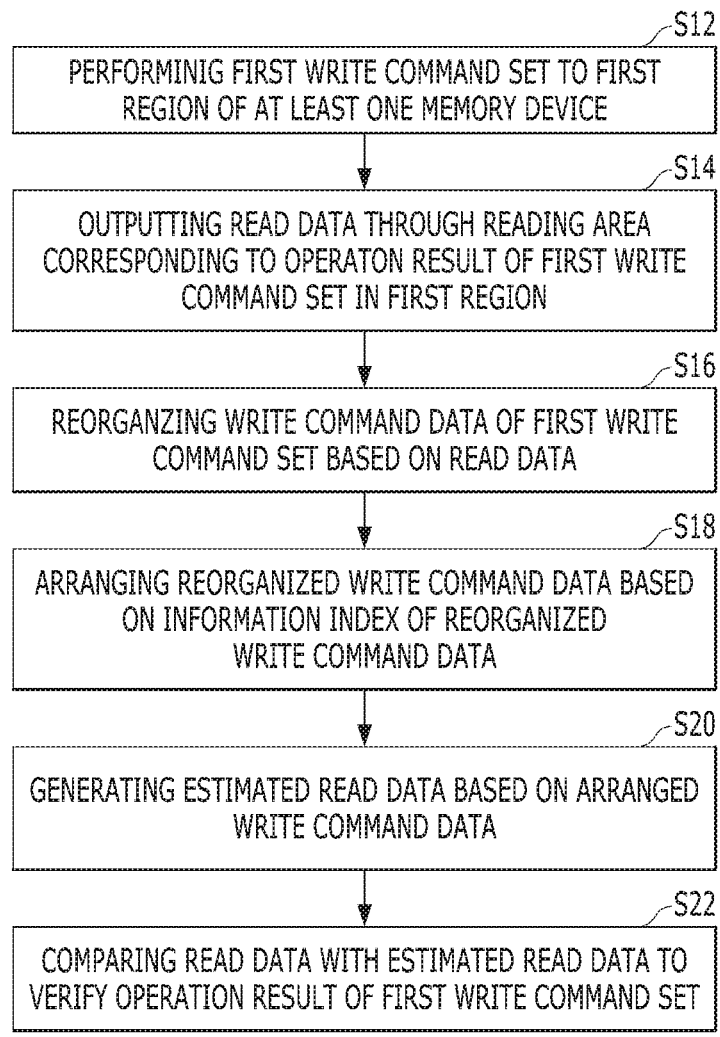
FIG. 7 is a flowchart illustrating a method for performing an operation of the memory system.

FIG. 7 illustrates a method for performing an operation of the memory system 100 in detail.

Referring to FIG. 7, the method can include processing a first write command set in a first region of a predetermined memory area (e.g., the first region of at least one memory device) (S12), outputting actual read data through actually reading a result of processing the first write command set in the first region (S14), reorganizing write command data of the first write command set based on the actual read data (S16), arranging the reorganized write command data based on an index of the reorganized write command data (S18), generating estimated read data based on the arranged write command data (S20), and comparing the actual read data with the estimated read data to verify the process result of the first write command set (S22).

According to an embodiment, in order to verify the operation performed in the memory system, a test device or a test module may perform an operation of reading and writing data in the first region, which is a part of a memory area, through a controller included in the memory system. For example, the test device or the test module may cause the controller to process a first write command set to the first region and/or actually read data stored in the first region.

According to an embodiment, the test device or the test module may be included in the controller included in the memory system. In this case, the controller can include the test module as well as a module for handling an operation in the memory system, such as a command queuing module for processing a command, a data input/output (I/O) module for processing data, an address handling module for mapping or managing a logical address and a physical address. In this case, the test device or the test module may access the memory device or memory area by using other modules in the controller.

Although not shown, the method for operating the memory system may further comprise generating the first write command set. For example, the first write command set may include a predetermined number of write command data. Herein, each of the plural write command data may be converted or simplified from a write command. Or, the write command data may be simulant. Each of plural write command data may be associated with, or include, a first information item for deriving a sequence of plural write command data.

Here, the first write command set can be distinguished from a write enable signal used in the memory system. For example, the first write command set includes a plurality of write command data used for verifying whether an operation of the memory system is normal. Herein, the write command data may be a type of data partially extracted from each write command. For example, the write command data can include the first information item that can imply an order or a sequence among the plurality of write command data, as well as an information item indicating a storage location in which the corresponding first information item is programmed or stored.

When an operation is performed in response to a predetermined number of write command data, a part of the write command data can be recorded in a predetermined area of the memory device. The predetermined area of the memory device can include a plurality of pages. The plurality of pages may be located in at least one block, at least one plane, or at least one die. For example, the predetermined area may include a region or a space range in which the operation can be verified through a single set of write commands. At least one operation performed in the memory device of the memory system can be verified through one or more test operations. The size of the predetermined area corresponding to each test operation can be differently determined.

After an operation in response to the first write command set including a predetermined number of write command data is performed in the memory device, the test module or the test device can access and read data stored in the memory device through the controller.

Generally, to verify an operation performed in a memory device, data to be stored in a memory device can be compared with data read from the memory device. It might be required to additionally record a history of operations of storing data in the memory device, for the data comparison. In such a case, it may be burdensome to additionally record a plurality of write operations whenever the plurality of write operations are performed because recording and managing the plurality of write operations for the data comparison requires using a resource. When information regarding the write operation is stored in the memory device as data and the stored data is read and reconstructed to track back the plurality of write operations, the above-described burden of separately recording and managing the plurality of write operations can be reduced.

Although not shown, the step S18 of arranging the reorganized write commands based on an index or a sequence of each reorganized write command data can include recognizing at least some of the plural write command data included in the first write command set and locations of the recognized pieces of the plural write command data in the first region, and sequentially sorting the recognized pieces of the write command data based on the index and the sequence.

Further, the step S20 of generating estimated read data can include extracting or selecting a most recently one among the sorted pieces of the plural write command data for each logical block address, and aligning the extracted or selected pieces of the plural write command data to generate the estimated read data.

FIG. 8A illustrates an example of a piece of the plural write command data. Second and fourth information items (e.g., write index and storage range) included in the piece of write command data of a predetermined format may be programmed at a specific location of the memory device, in response to a policy, a preset, or an item included in the piece of write command data. For example, the specific location may be determined based on an address preset (e.g., preset address translation) and a third information item also included in the piece of write command data. Such programmed second and fourth information items may be accessed and outputted in response to a read command or a read instruction.

Referring to FIG. 8A, the piece of write command data 22 includes a write history, i.e., a history of write or program operations performed in the memory system. The piece of write command data 22 can be outputted from a specific location in the memory device. The piece of write command data 22 can include a second information item (e.g., Write Index) indicating or implying which set the piece of the write command data is included (e.g., a first write command set or a second write command set shown in FIG. 8B), a third information item (e.g., Current LBA) indicating a specific accessible address of the piece of the write command data, which is used by a test module or an external device for diagnosis, and a fourth information item (e.g., Start LBA, End LBA) indicating an address range that the test module or the external device can access, at which the piece of write command data included in the first write command set are to be stored within the memory device. The write command data 22 can include a dummy which has no specific meaning for this operation. The dummy can assist a write or program operation when a total length of the write command data 22 can be equal to that of a distinct group of memory cells which are programmable together as a unit (e.g., a page, or the like). As not shown, the write command data 22 can include a first information item ('Write Command' shown in FIG. 9) indicating or implying a sequence or an order of plural write command data included in a specific write command set.

By way of example but not limitation, when accessing a specific location corresponding to the third information item (e.g., Current LBA) within the memory device, at least the second information item (e.g., Write Index) and the fourth information item (e.g., Start LBA & End LBA) can be obtained. Here, the second information item (e.g., Write Index) and the fourth information item (e.g., Start LBA & End LBA) are stored in the storage range defined by the fourth information item (e.g., Start LBA & End LBA) within the memory device and classified into the first or second write command set (see FIGS. 7 and 8B) each including a plurality of write command data. Additionally, a specific position corresponding to the third information item (e.g., Current LBA) may be associated with the storage range determined by the fourth information item (e.g., Start LBA & End LBA). According to an embodiment, the group or the range indicated by the fourth information item (e.g., Start LBA & End LBA) may include plural continuous physical or logical locations, or physical or logical locations of a sequence calculated in a predetermined manner. For example, the third information item and the fourth information item may include a type of logical block address (LBA) used for determining the specific location corresponding to a piece of the write command data and the storage range of the plural write command data corresponding to the write command set.

When data (e.g., the second and fourth information items) is collected from the storage range including the specific location (e.g., Current LBA) within the memory device, it is possible for the memory system to recognize the read data including a plurality of data units, each of which corresponds to each of logical block addresses in the predetermined area.

Referring to FIG. 8B, two write operations corresponding to two write command sets are described. A first write operation (1st Write) corresponding to a first write command set can be identified by the write index or the second information item (for example, 0x0) of each piece of the plural write command data. Corresponding to the first write command set, a storage range corresponding to the fourth information item (e.g., LBA 0x10 to 0x14) can store the second information item (e.g., 0x0) and the first information item shown in FIG. 9. The second information item corresponding to the first write command set can be stored in respective positions corresponding to the third information items of the respective five pieces of write command data. By way of example but not limitation, the second information item 0x0 is stored in a first specific position corresponding to the third information item 0x10 of a first piece of the plural write command data. The first specific position can be included in the storage range identified by the fourth information item 0x10 and 0x14. A zero pattern or a dummy pattern may be recorded in the remaining portion in each of the positions. The second information item 0x0 is also stored in a second specific position corresponding to the third information item 0x11 of a second piece of the plural write command data. The second specific position can be included in the storage range identified by the fourth information item 0x10 and 0x14. The second information item 0x0 is stored in third to fifth specific positions respectively corresponding to the third information items 0x12, 0x13, 0x14 of third to fifth pieces of the plural write command data. The third to fifth specific position can be included in the storage range identified by the fourth information item 0x10 and 0x14. A test module or an external device can read plural data stored in the first to fifth specific positions in the memory device 150, and then recognize that the plural data read is associated with the first write command set based on the second information 0x0 stored therein.

In a second write operation (2nd Write) corresponding to a second write command set, the write index or the second information item (for example, 0x1) of the plural write command data corresponding to the second write command set and the storage range or the fourth information item (e.g., LBA 0x3 to 0x7) can be stored. The second information item corresponding to the second write command set can be stored in respective positions corresponding to the third information items of the respective five pieces of write command data. By way of example but not limitation, the second information item 0x1 of the plural write command data is stored in another first specific position corresponding to the third information item 0x3 of a first piece of the plural write command data. The another first specific position can be included in another storage range identified by the fourth information item 0x3 and 0x7. A zero pattern or dummy pattern may be recorded in the remaining part in each of the positions. The second information item 0x1 is stored in another second specific position corresponding to the third information item 0x4 of a second piece of the plural write command data. The another second specific position can be included in the storage range identified by the fourth information item 0x3 and 0x7. The second information item 0x1 is stored in other third to fifth specific positions respectively corresponding to the third information item 0x5, 0x6, 0x7 of third to fifth pieces of the plural write command data. The other third to fifth specific positions can be included in the storage range identified by the fourth information item 0x3 and 0x7. The test module or the external device can read plural data stored in the other first to fifth specific positions in the memory device 150, and then recognize that the plural data read is associated with the second write command set based on the second information 0x1 stored therein.

Hereinafter, a method for verifying an operation performed in the memory device will be described with reference to FIGS. 9 to 11.

Figure 9:
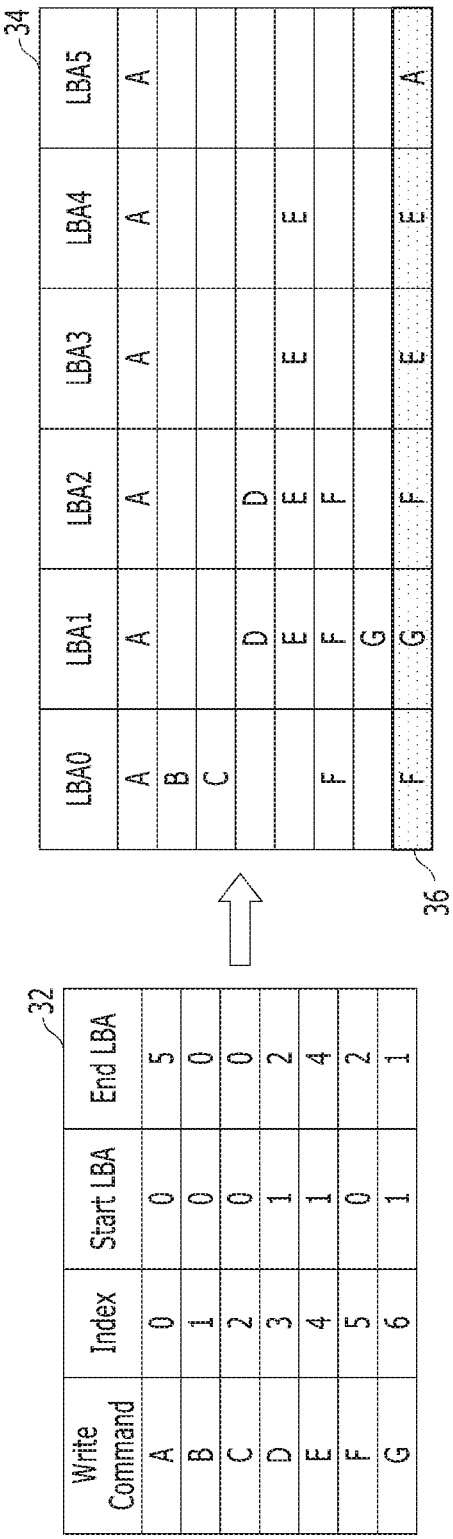
FIG. 9 is a diagram illustrating a first write command set and read data outputted from a predetermined area in a memory device.

FIG. 9 illustrates an example of a first write command set and an example of read data outputted from a predetermined area in the memory device.

As shown, the first write command set 32 may include seven pieces of write command data which are distinguishable to each other based on the first information item (i.e., Write Command) A to G indicating an index or a sequence of the write command data in the first write command set 32. Here, the number of write command data included in the first write command set 32 may vary according to an embodiment. For example, ten or twenty write command data may be included in one write command set, and two or three write command data may be included in one write command set.

Each write command data may include the first information item or the write command having a value ranging A to G that indicates or implies an execution sequence of the plural write command data. The first information items having an alphabetical order are shown as an example, but it is possible to utilize information of various patterns which can determine the order or index according to an embodiment.

FIGS. 9 to 14 illustrate a "sequence" field for better understanding the sequence of the write command data. For example in FIG. 9, the sequence of the first write command data having the write command A (hereinafter, referred to as the first write command data A) is 0, and the first write command data A can be stored in the storage range corresponding to the fourth information item (i.e., specific locations corresponding to the 0th LBA to the 5th LBA). After an operation in response to the first write command data A is executed, the first and fourth information items (i.e., the write command and the storage range information) of the first write command data A can be stored in storage locations corresponding to the 0th to 5th LBA. Then, the sequence of the second write command data B is 1, and the second write command data B can be stored only in the specific location corresponding to the 0th LBA because the storage range is associated with only the 0th LBA. After an operation of the second write command data B is executed, the second write command data B is stored in the specific location corresponding to 0th LBA. Like the second write command data B, the third write command data C can also be stored in a location corresponding to the 0th LBA only. Operations in response to the third write command data C and the fourth write command data D can be sequentially executed. Then, following operations can be performed sequentially until the last operation in response to the seventh write command data G can be executed.

As shown in an operation history table 34, when the first write command set 32 is executed in the memory device, the first to fourth information items (e.g., the write command, the write index and the storage range information) of the write command data A, B, C, D, E, F, G can be stored in the specific locations of the memory device, which are corresponding to the LBA0 to LBA5. For example, write command data A, B, C, F may be sequentially stored in a first location corresponding to a first logical block address LBA0. Practically, since the memory device does not support overwrite mechanism, pieces of the write command data A, B, C, F may be programmed sequentially in different locations, but map translation can support that the different locations are associated with each logical block address and the last programmed locations for each write command data can be matched with each logical block address. When the first write command set 32 is executed, the write command data F corresponding to the last operation regarding the first logical block address LBA0 can remain in a location corresponding to the first logical block address LBA0. Write command data A, D, E, F, G can be sequentially stored in a second location corresponding to a second logical block address LBA1 when the first write command set 32 is performed. The last written write command data G remains in the second location corresponding to a second logical block address LBA1. After all the first write command set 32 is performed, the corresponding locations of the memory device, which are associated with the logical block addresses, are accessed by the test device or the test module to output read data 36, wherein the corresponding locations associated with the logical block addresses are also referred as a current reference. The read data 36 having the write command values of F, G, F, E, E, A in an order of the locations corresponding to the logical block addresses LBA0 to LBA5 can be outputted. The test device or the test module can check whether the read data 36 of F, G, F, E, E, A is valid. When the read data 36 is valid, the test device can determine that all operations corresponding to the plural write command data included in the first write command set 32 were performed normally in the memory device.

The operation history table 34 is described for facilitating understanding. However, it might not be necessary to store or record additional information or contents such as the operation history table 34 in the memory system or the test device, which can cause an operational burden or an overhead.

FIG. 10 describes a method for reconstructing or reorganizing a write command set based on the read data 36.

As shown in the operation history table 34, based on the read data 36 of F, G, F, E, E, A for the corresponding logical block address LBA0 to LBA5 of the memory device in which the first write command set 32 has been executed, the write command set 32 may be reconfigured or reorganized to generate information such as a reorganization table 38.

Unlike the operation history table 34 configured based on an inputted write command set, the reorganization table 38 is generated based on the read data 36 outputted from the memory device. The reorganization table 38 does not check whether an operation corresponding to the write command data which is not included in the read data 36 is normally performed. For example, some pieces F, G, F, E, E, A of the write command data are included in the read data 36, but the other pieces B, C, D of the write command data are not included in the read data 36. That is, the reorganization table 38 may not be used to verify any operation corresponding to the write command data B, C, D which are not included in the read data 36.

In the read data 36, the write command data F most recently stored in a location corresponding to the first logical block address LBA0 is outputted. A data unit outputted from the location corresponding to the first logical block address LBA0 can include the first information item, i.e., the write command data F, the value of which represents the sequence of the write command data F in the first write command set 32. The value 'F' of the write command can indicate a sixth write command data among 7 write command data A to G. Further, the data unit outputted from the location corresponding to the first logical block address LBA0 includes the fourth information item, i.e., the storage range as described with reference to FIGS. 8A and 9. Based on the data unit outputted corresponding to the first logical block address LBA0, it is possible to identify that the write command data F is stored in the storage range corresponding to the logical block addresses LBA0 to LBA2. Based on this, it can be inferred that the sixth write command data F is stored in locations corresponding to the first to third logical block addresses LBA0 to LBA2 when the reorganization table 38 is generated.

Next, the write command data G in the read data 36 is outputted from the location corresponding to the second logical block address LBA1. A data unit outputted corresponding to the second logical block address LBA1 can include the write command data G, the value of which represents the sequence of the write command data G in the first write command set 32. The value 'G' of the write command data can indicate a seventh write command data among 7 write command data A to G. Referring to the data unit outputted corresponding to the second logical block address LBA1, it is possible to confirm that the write command data G is stored only in the second logical block address LBA1. Based on this, it can be inferred that the seventh write command data G is stored in the location corresponding to the second logical block address LBA1 when the reorganization table 38 is generated.

Next, the read data 36 can include the write command data F corresponding to the third logical block address LBA2. A data unit outputted from the location associated with the third logical block address LBA2 includes the write command data F, the value of which represents the sequence of the write command data F in the first write command set 32. The value 'F' of the write index can indicate a sixth write command data among 7 write command data A to G. Based on the data unit outputted from the location corresponding to the third logical block address LBA2, it is possible to identify that the write command data F is stored in the locations corresponding to the first to third logical block addresses LBA0 to LBA2. Based on this, it can be inferred that the sixth write command data F is stored in the locations corresponding to the first to third logical block addresses LBA0 to LBA2 when the reorganization table 38 is generated.

Next, the read data 36 can include the write command data E outputted from the location corresponding to the fourth logical block address LBA3. A data unit outputted corresponding to the fourth logical block address LBA3 can include the write command data E, the value of which represents the sequence of the write command data E in the first write command set 32. The value 'E' of the write index can indicate a fifth write command data among 7 write command data A to G. Based on the data unit outputted from the location corresponding to the fourth logical block address LBA3, it is possible to identify that the write command data E is stored in locations associated with the second to fifth logical block addresses LBA1 to LBA4. Based on this, it can be inferred that the fifth write command data E is stored in the locations corresponding to the second to fifth logical block addresses LBA1 to LBA4 when the reorganization table 38 is generated.

Next, in the read data 36, the write command data E can be included, which is outputted from the location corresponding to the fifth logical block address LBA4. When the write command data E outputted from the location associated with the fifth logical block address LBA4 is normal, a data unit outputted corresponding to the fifth logical block address LBA4 might be partially identical to the data unit outputted corresponding to the fourth logical block address LBA3.

Next, in the read data 36, the write command data A is outputted from the location identified by the sixth logical block address LBA5. A data unit outputted corresponding to the sixth logical block address LBA5 can include the write command data A, the value of which represents the sequence of the write command data A in the first write command set 32. The value 'A' of the write index can indicate a first write command data among 7 write command data A to G. Based on the data unit outputted from the sixth logical block address LBA5, it is possible to identify that the write command data A is stored from the first logical block address LBA0 to the sixth logical block address LBA5. Based on this, it can be inferred that the write command data A, is stored in the locations associated with the first to sixth logical block addresses LBA0 to LBA5 when the reorganization table 38 is generated. As described above, the reorganization table 38 can be generated for verification, based on the read data 36.

FIG. 11 illustrates an example of a method for arranging information in the reorganization table 38 according to the sequence of the write command data. Referring to FIGS. 9 and 10, the reorganization table 38 can be derived from at least a part (i.e., the first and fourth information items) of the first write command set 32 based on a result obtained by parsing the read data 36.

Referring to FIG. 11, the reorganization table 38 may be used to generate a restoration table 40 that is arranged based on the sequence of the write command data in the first write command set 32. It is possible to arrange the write command data based on the sequence to generate the estimated read data 42 including the first and fourth information items of the write command data from the most recently stored write command for each location corresponding to each logical block address LBA within a range or locations identified by the fourth information items (i.e., the information of the storage range) of the write command data in the memory device.

The estimated read data 42 can be compared with the read data 36 collected from the locations corresponding to the logical block addresses LBA0 to LBA5 in the memory device so that it can be verified whether operations in response to the first write command set 32 are normally performed in locations corresponding to the logical block addresses LBA0 to LBA5 of the memory device. When the estimated read data 42 and the read data 36 are identical, the test device or the test module can determine that there is no error during operations in response to the first write command set 32.

Hereinafter, a case where a defect or an operation error occurs in the memory device will be described as an example with reference to FIGS. 12 to 14.

FIG. 12 illustrates an example of the first write command set 32 and an example of read data 46 outputted from a predetermined area of the memory device. Here, the first write command set 32 is the same as that described in FIG. 9. For example, the first write command set 32 can include seven write command data respectively having the write index of values A to G and is stored in some locations or areas corresponding to logical block addresses LBA0 to LBA5 in the memory device. In addition, an operation history table 44 is described to facilitate understanding. However, it might be not necessary to additionally record the operation history table 44 in the memory system or the test device, which can cause operational burden.

Unlike an example shown in FIG. 9, the fifth write command data E is not normally stored in the fourth logical block address LBA3 in the operation history table 44 of FIG. 12. But, the other write command data included in the first write command set have been normally performed. In this case, the read data 46 outputted from the partial areas corresponding to the logical block addresses LBA0 to LBA5 of the memory device may have the write index values "F, G, F, A, E, A".

FIG. 13 illustrates an example of a method for reconstructing or reorganizing the write command data of the first write command set 32, based on the read data 46.

Referring to FIG. 13, the read data 46 of "F, G, F, A, E, A" is outputted from the locations or areas of the memory device, which correspond to the logical block addresses LBA0 to LBA5, after the first write command set 32 is executed. The first write command set 32 may be reconfigured based on the read data 46 to generate information such as a reconstruction table 48.

Unlike the operation history table 44 in which all data of the first write command set 32 are sequentially written, the reconstruction 48 can be generated on a basis of the read data 46. Thus, even though an operation in response to any write command data is normally executed but not included in the read data 46, information relevant to that write command data may be omitted in the reconstruction table 48. It may not be verified whether that operation is normally executed. For example, since only the write command data of F, G, F, A, E, A remain in the read data 46, the write command data B, C, D are not considered.

The write command data F in the read data 46 is outputted from the location corresponding to the first logical block address LBA0. The information or data outputted corresponding to the first logical block address LBA0 includes the write command data F representing the sequence of the write command data F among total write commands in the first write command set 32. Based on the data unit outputted from the location associated with the first logical block address LBA0, it is possible to identify that the write command data F is stored in locations corresponding to the first to third logical block addresses LBA0 to LBA2. Based on this, it can be inferred that the sixth write command data F is stored in the locations associated with the first to third logical block addresses LBA0 to LBA2 when the reconstruction table 48 is generated.

Then, the read data 46 can include the write command data G outputted from the location corresponding to the second logical block address LBA1. A data unit outputted corresponding to the second logical block address LBA1 can include the write command data G representing the sequence of the write command data G (e.g., 'G' can indicate a seventh write command among 7 write commands) in the first write command set 32. Referring to the data unit outputted from the location corresponding to the second logical block address LBA1, it is possible to confirm that the write command data G is stored only in the location associated with the second logical block address LBA1. Based on this, it can be inferred that the write command data G, i.e., the seventh write command, is stored in the location corresponding to the second logical block address LBA1 when the reconstruction table 48 is generated.

Next, the write command data F in the read data 46 is outputted from the location corresponding to the third logical block address LBA2. A data unit outputted corresponding to the third logical block address LBA2 includes the write command data F representing the sequence of the write command data F (e.g., 'F' can indicate a sixth write command). Based on the data unit outputted corresponding to the third logical block address LBA2, it is possible to verify that the write command data F is stored in the locations associated with the first to third logical block addresses LBA0 to LBA2. Based on this, it can be inferred that the sixth write command data F is stored from the first area LBA0 to the third area LBA2 when the reconstruction table 48 is generated.

Next, the read data 46 includes the write command data A, which is outputted from the location corresponding to the fourth logical block address LBA3, because an operation of the write command data E may be abnormally performed. A program or read operation regarding the write command data E that should be stored after the write command data A was stored in the location corresponding to the fourth logical block address LBA3 might not have been normally performed. A data unit outputted from the location corresponding to the fourth logical block address LBA3 can include the write command data A representing the sequence of the write command data A (e.g. 'A' can indicate a first write command among 7 write commands) in the first write command set 32. Based on the data unit outputted from the fourth logical block address LBA3, it is possible to identify that the write command data A is stored from the locations associated with the first to sixth logical block addresses LBA0 to LBA5. Based on this, it can be inferred that the write command data A, is stored in the locations corresponding to the first logical block addresses LBA0 LBA5 when the reconstruction table 48 is generated.

Next, the write command data E in the read data 46 is outputted from the location identified by the fifth logical block address LBA4. A data unit outputted corresponding to the fifth logical block address LBA4 can include the write command data E representing the sequence of the write command data E (e.g., 'E' can indicate a fifth write command among 7 write commands). Based on the data unit outputted from the location corresponding to the fifth logical block address LBA4, it is possible to identify that the write command data E is stored from the locations associated with the second to fifth logical block addresses LBA1 to LBA4. Based on this, it can be inferred that the fifth write command data E is stored in the locations corresponding to the second to fifth logical block addresses LBA1 to LBA4 when the reconstruction table 48 is generated.

Then, the read data 46 can include the write command data A outputted from the location corresponding to the sixth logical block address LBA5. A data unit outputted corresponding to the sixth logical block address LBA5 can include the write command data A representing the sequence of the write command data A (e.g. 'A' can indicate a first write command among 7 write commands) in the first write command set 32. Based on the data unit outputted from the location corresponding to the sixth logical block address LBA5, it is possible to identify that the write command data A is stored in the location associated with the first to sixth logical block addresses LBA0 to LBA5. Based on this, it can be inferred that the write command data A, is stored in the locations corresponding to the first to sixth logical block addresses LBA0 to LBA5 when the reconstruction table 48 is generated. As described above, the reconstruction table 48 can be generated for verification, based on the read data 46.

Figure 14:
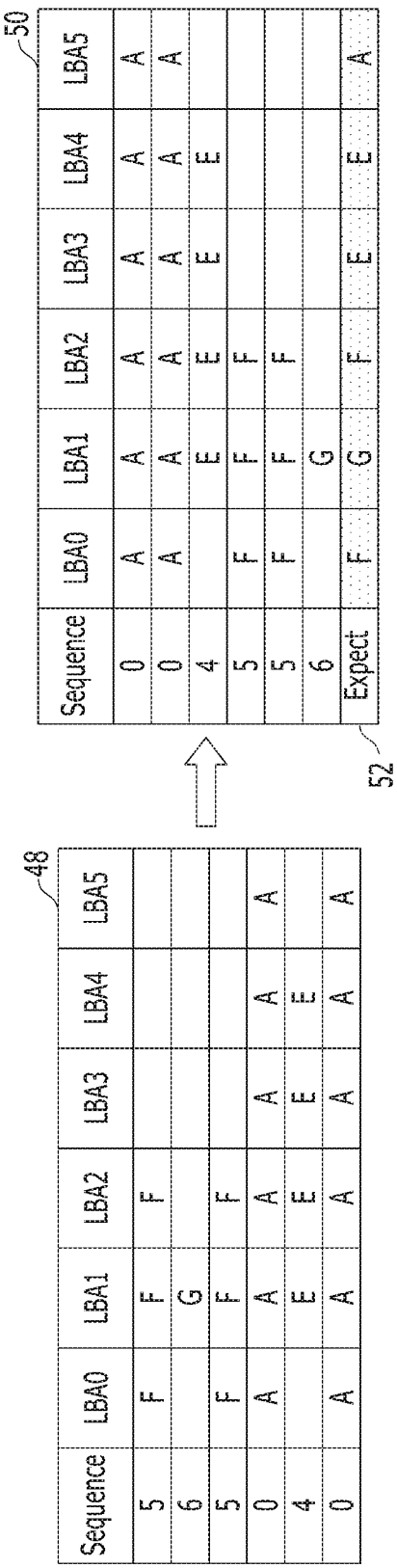

FIG. 14 illustrates an example of a method for arranging items of reconstruction tables 48 according to the sequence of the write command data included in the first write command set 32. Here, referring to FIG. 14, the reconstruction table 48 is obtained by inferring at least a part (i.e., the first and fourth information items) of the first write command set 32 based on a result obtained by parsing the read data 46.

Referring to FIG. 14, the reconstruction table 48 may be used to generate a restoration table 50 arranged based on the sequence of the write command data. After the write command data are arranged based on the sequence, the test device or the test module can generate the estimated read data 52 including the first and fourth information items of the write command data from the most recently stored write index for each location corresponding to each logical block address LBA within a range identified by the fourth information items (i.e., the information of the storage range) of the write command data in the memory device.

Herein, the estimated read data 52 of "F, G, F, E, E, A" obtained from the restoration table 50 is not identical to the read data 46 of "F, G, F, A, E, A" which is outputted from the locations or areas of the memory device corresponding to the logical block addresses LBA0 to LBA5. It can be determined that at least some of the first write command set 32 performed in the areas of the memory device, which correspond to the logical block addresses LBA0 to LBA5, was not performed normally. Thus, it can be easily recognized that there is an error in the writing or reading operation related to the specific location corresponding to the logical block address LBA3 in the memory device because the write command data stored in the specific location corresponding to the logical block address LBA3 is A, not expected E.

On the other hand, referring to FIGS. 9 to 14, the lengths of the read data and the estimated read data can be the same. The lengths of the read data 36, 46 and the estimated read data 42, 52 can correspond to the number of write command data in the first write command set 32 and the sizes of the areas of the memory device, which correspond to the logical block addresses LBA0 to LBA5. For example, the length of the read data 36, 46 is determined at least based on the number of bits obtained by binarizing the number of write command data included in the first write command set 32 by the number of bits of the logical block address indicating the corresponding region in the memory device. By way of example but not limitation, the length can be lesser than, or equal to, the number of bits in a page. Further, the length can be larger than, or equal to, a value which is a binarization value of the number of write command data, included in the first write command set, multiplied by the number of logical block addresses corresponding to the areas.

According to an embodiment, the test device or test module can verify operations performed in response to plural write commands. When the memory system is in an idle state, the test module can check which block is a bad block or monitor which block might be not healthy. For verification, the memory system can use simulant write commands which having a sequence therebetween, not actual write commands with data.

Figure 15:
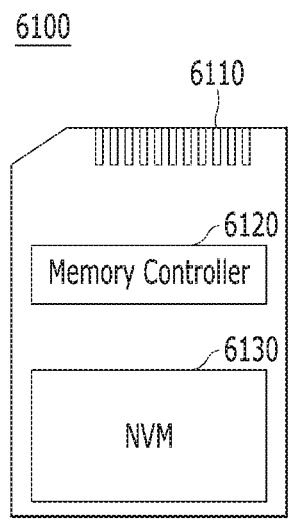
FIGS. 15 to 23 are diagrams schematically illustrating other examples of data processing systems including a memory system according to embodiments of the invention.

In FIG. 15, another example of the data processing system including the memory system in accordance with an embodiment is described. FIG. 15 schematically illustrates a memory card system to which the memory system is applied.

Referring to FIG. 15, the memory card system 6100 may include a memory controller 6120, a memory device 6130 and a connector 6110.

The memory controller 6120 may be connected to the memory device 6130 embodied by a nonvolatile memory. The memory controller 6120 may be configured to access the memory device 6130. By way of example and not limitation, the memory controller 6120 may be configured to control read, write, erase and background operations of the memory device 6130. The memory controller 6120 may be configured to provide an interface between the memory device 6130 and a host, and use a firmware for controlling the memory device 6130. That is, the memory controller 6120 may correspond to the controller 130 of the memory system 110 described with reference to FIGS. 1 and 2, and the memory device 6130 may correspond to the memory device 150 of the memory system 110 described with reference to FIGS. 1 and 5.

Thus, the memory controller 6120 may include a RAM, a processor, a host interface, a memory interface and an error correction component. The memory controller 6120 may further include the elements shown in FIGS. 1 and 2.

The memory controller 6120 may communicate with an external device, for example, the host 102 of FIG. 1 through the connector 6110. For example, as described with reference to FIG. 1, the memory controller 6120 may be configured to communicate with an external device according to one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system may be applied to wired/wireless electronic devices, particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 6.

The memory controller 6120 and the memory device 6130 may be integrated into a single semiconductor device. For example, the memory controller 6120 and the memory device 6130 may be so integrated to form a solid state driver (SSD). In another embodiment, the memory controller 6120 and the memory device 6130 may be integrated to form a memory card such as a PC card (PCMCIA: Personal Computer Memory Card International Association), a compact flash (CF) card, a smart media card (e.g., a SM and a SMC), a memory stick, a multimedia card (e.g., a MMC, a RS-MMC, a MMCmicro and an eMMC), an SD card (e.g., a SD, a miniSD, a microSD and a SDHC) and/or a universal flash storage (UFS).

Figure 16:
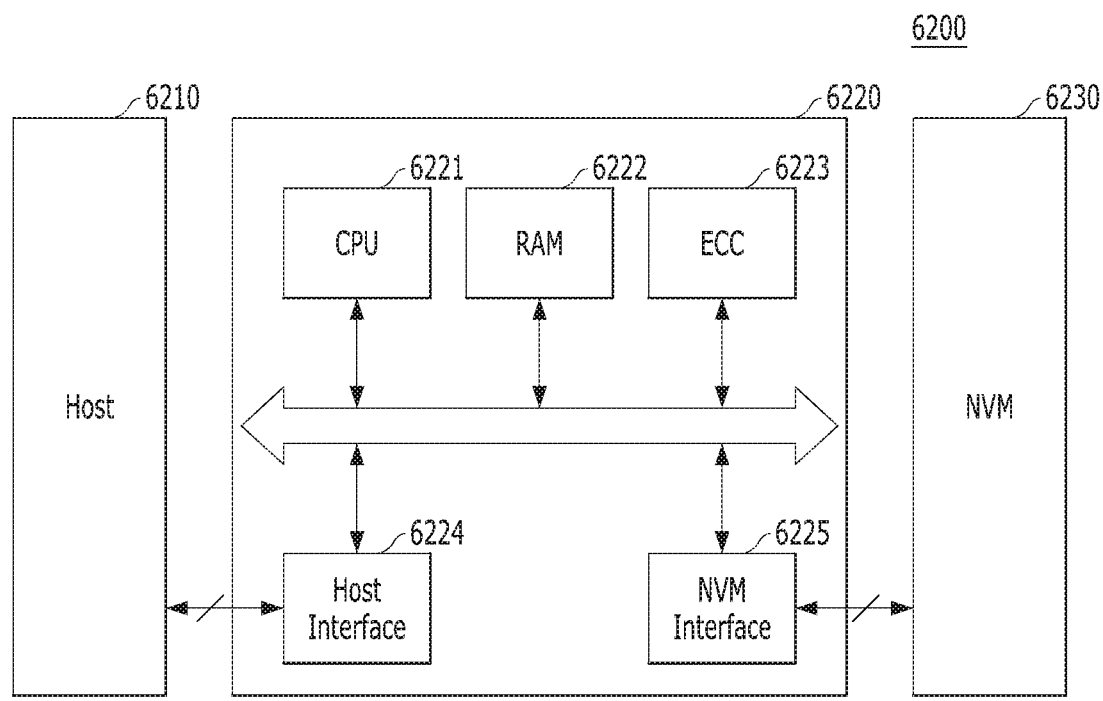

FIG. 16 is a diagram schematically illustrating another example of the data processing system including the memory system in accordance with an embodiment.

Referring to FIG. 16, the data processing system 6200 may include a memory device 6230 having one or more nonvolatile memories and a memory controller 6220 for controlling the memory device 6230. The data processing system 6200 illustrated in FIG. 16 may serve as a storage medium such as a memory card (CF, SD, micro-SD or the like) or USB device, as described with reference to FIGS. 1 and 2. The memory device 6230 may correspond to the memory device 150 in the memory system 110 illustrated in FIGS. 1 and 5. The memory controller 6220 may correspond to the controller 130 in the memory system 110 illustrated in FIGS. 1 and 5.

The memory controller 6220 may control a read, write or erase operation on the memory device 6230 in response to a request of the host 6210. The memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221. The RAM 6222 may be used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC circuit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may exchange data with the host 6210 through the host interface 6224. The memory controller 6220 may exchange data with the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and exchange data with the external device. Particularly, as the memory controller 6220 is configured to communicate with the external device through one or more of various communication protocols, the memory system and the data processing system in accordance with an embodiment may be applied to wired/wireless electronic devices, particularly a mobile electronic device.

Figure 17:
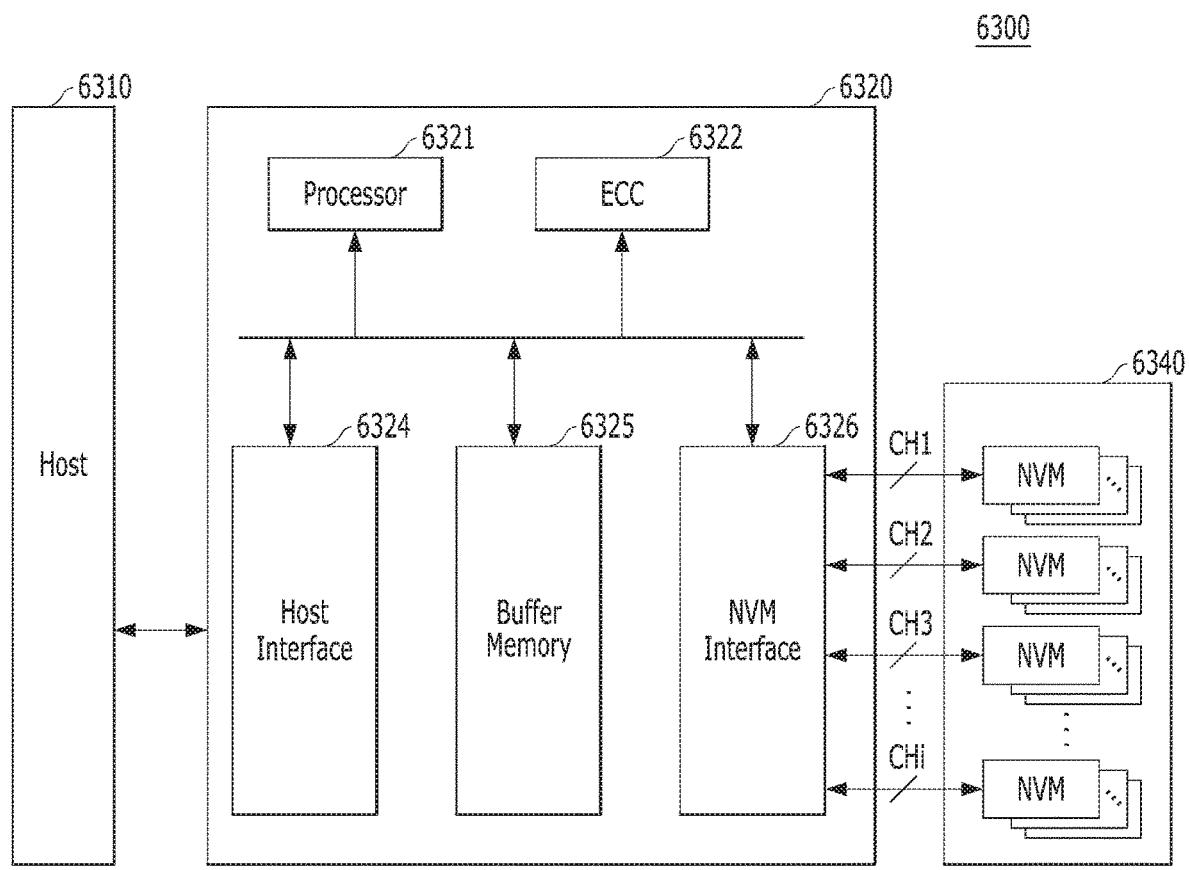

FIG. 17 is a diagram schematically illustrating another example of the data processing system including the memory system in accordance with an embodiment. FIG. 17 schematically illustrates an SSD to which the memory system is applied.

Referring to FIG. 17, the SSD 6300 may include a controller 6320 and a memory device 6340 including a plurality of nonvolatile memories. The controller 6320 may correspond to the controller 130 in the memory system 110 of FIGS. 1 and 2. The memory device 6340 may correspond to the memory device 150 in the memory system of FIGS. 1 and 5.

Specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by any of various volatile memories such as DRAM, SDRAM, DDR SDRAM, LPDDR SDRAM and GRAM or nonvolatile memories such as FRAM, ReRAM, STT-MRAM and PRAM. FIG. 17 illustrates that the buffer memory 6325 is disposed in the controller 6320. However, the buffer memory 6325 may be disposed externally to the controller 6320.

The ECC circuit 6322 may calculate an ECC value of data to be programmed to the memory device 6340 during a program operation. The ECC circuit 6322 may perform an error correction operation on data read from the memory device 6340 based on the ECC value during a read operation. The ECC circuit 6322 may perform an error correction operation on data recovered from the memory device 6340 during a failed data recovery operation.

The host interface 6324 may provide an interface function with an external device, for example, the host 6310. The nonvolatile memory interface 6326 may provide an interface function with the memory device 6340 connected through the plurality of channels.

Furthermore, a plurality of SSDs 6300 to which the memory system 110 of FIGS. 1 and 5 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300. The RAID controller may output data corresponding to the write command to the selected SSDs 6300. Furthermore, when the RAID controller performs a read operation in response to a read command provided from the host 6310, the RAID controller may select one or more memory systems or SSDs 6300 according to a plurality of RAID levels, that is, RAID level information of the read command provided from the host 6310 in the SSDs 6300. The RAID controller may provide data read from the selected SSDs 6300 to the host 6310.

Figure 18:
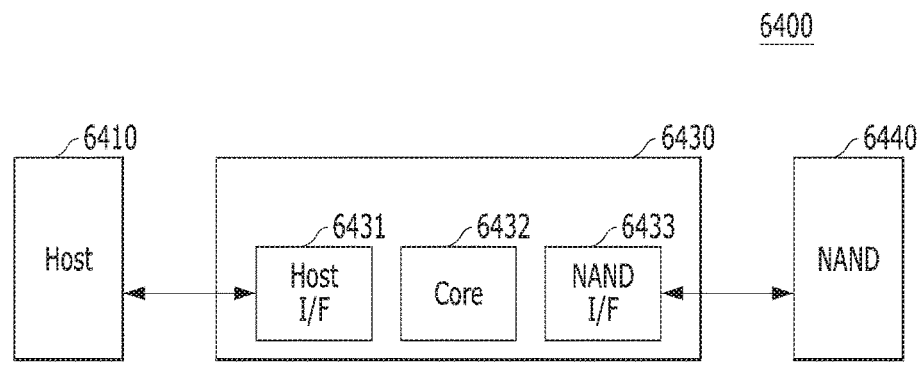

FIG. 18 is a diagram schematically illustrating another example of the data processing system including the memory system in accordance with an embodiment. FIG. 18 schematically illustrates an embedded Multi-Media Card (eMMC) to which the memory system is applied.

Referring to FIG. 18, the eMMC 6400 may include a controller 6430 and a memory device 6440 embodied by one or more NAND flash memories. The controller 6430 may correspond to the controller 130 in the memory system 110 of FIGS. 1 and 2. The memory device 6440 may correspond to the memory device 150 in the memory system 110 of FIGS. 1 and 5.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400. The host interface 6431 may provide an interface function between the controller 6430 and the host 6510. The NAND interface 6433 may provide an interface function between the memory device 6440 and the controller 6430. For example, the host interface 6431 may serve as a parallel interface, such as, an MMC interface described with reference to FIG. 1. Furthermore, the host interface 6431 may serve as a serial interface, for example, UHS ((Ultra High Speed)-I/UHS-II) interface.

FIGS. 19 to 22 are diagrams schematically illustrating other examples of the data processing system including the memory system in accordance with embodiments. FIGS. 19 to 22 schematically illustrate UFS (Universal Flash Storage) systems to which the memory system is applied.

Referring to FIGS. 17 to 20, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices, particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices, particularly mobile electronic devices through UFS protocols, and the UFS devices 6520, 6620, 6720, 6820 and the UFS cards 6530, 6630, 6730, 6830 may be embodied by the memory system 110 illustrated in FIGS. 1 and 5. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 13 to 16, and the UFS cards 6530, 6630, 6730, 6830 may be embodied in the form of the memory card system 6100 described with reference to FIG. 15.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through various protocols other than the UFS protocol, for example, an UFDs, a MMC, a SD, a mini-SD, and a micro-SD.

Figure 19:
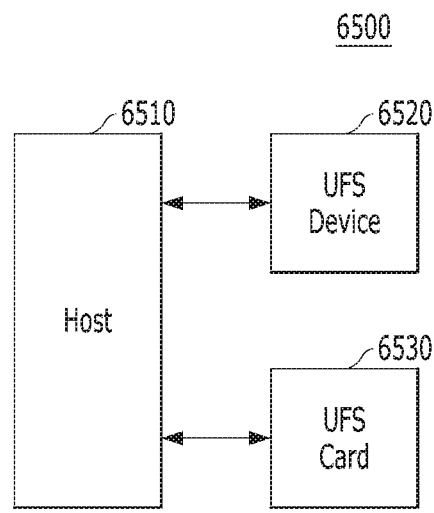

In the UFS system 6500 illustrated in FIG. 19, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the embodiment of FIG. 19, the configuration in which one UFS device 6520 and one UFS card 6530 are connected to the host 6510 is illustrated by way of example. However, in another embodiment, a plurality of UFS devices and UFS cards may be connected in parallel or in the form of a star to the host 6510. The form of a star is an arrangement where a single centralized component is coupled to plural devices for parallel processing. A plurality of UFS cards may be connected in parallel or in the form of a star to the UFS device 6520 or connected in series or in the form of a chain to the UFS device 6520.

Figure 20:
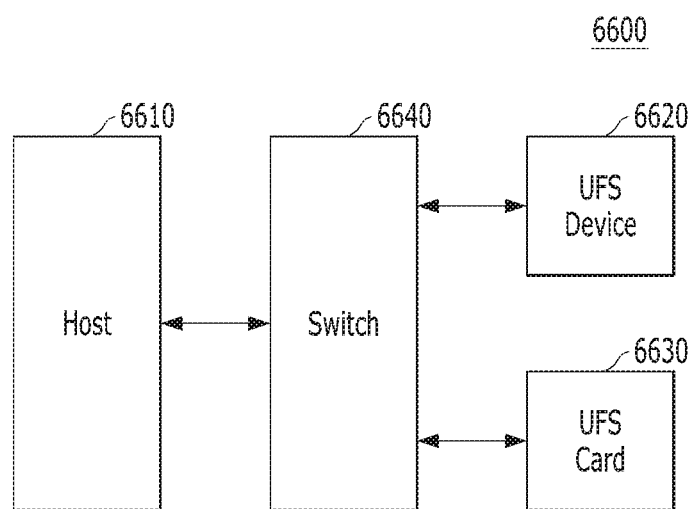

In the UFS system 6600 illustrated in FIG. 20, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the embodiment of FIG. 20, the configuration in which one UFS device 6620 and one UFS card 6630 are connected to the switching module 6640 is illustrated by way of example. However, in another embodiment, a plurality of UFS devices and UFS cards may be connected in parallel or in the form of a star to the switching module 6640, and a plurality of UFS cards may be connected in series or in the form of a chain to the UFS device 6620.

Figure 21:
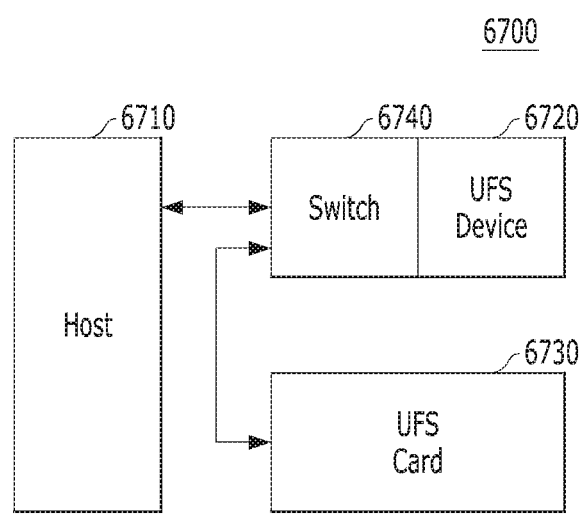

In the UFS system 6700 illustrated in FIG. 21, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the embodiment of FIG. 21, the configuration in which one UFS device 6720 and one UFS card 6730 are connected to the switching module 6740 is illustrated by way of example. However, in another embodiment, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 22:
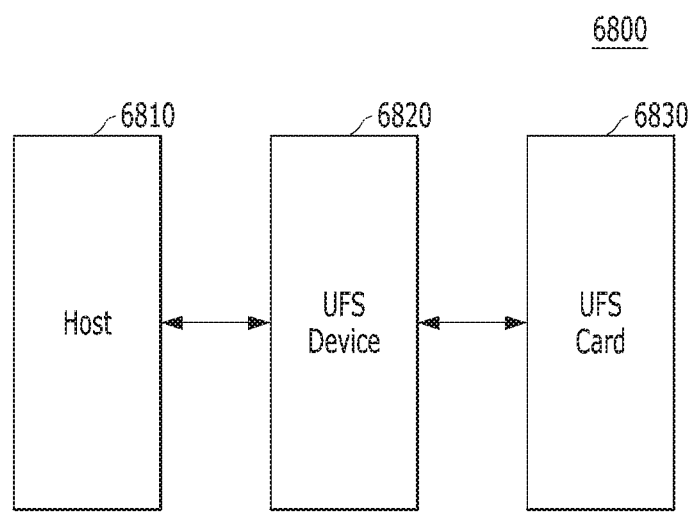

In the UFS system 6800 illustrated in FIG. 22, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In the embodiment of FIG.

22, the configuration in which one UFS device 6820 is connected to the host 6810 and one UFS card 6830 is connected to the UFS device 6820 is illustrated by way of example. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 23:
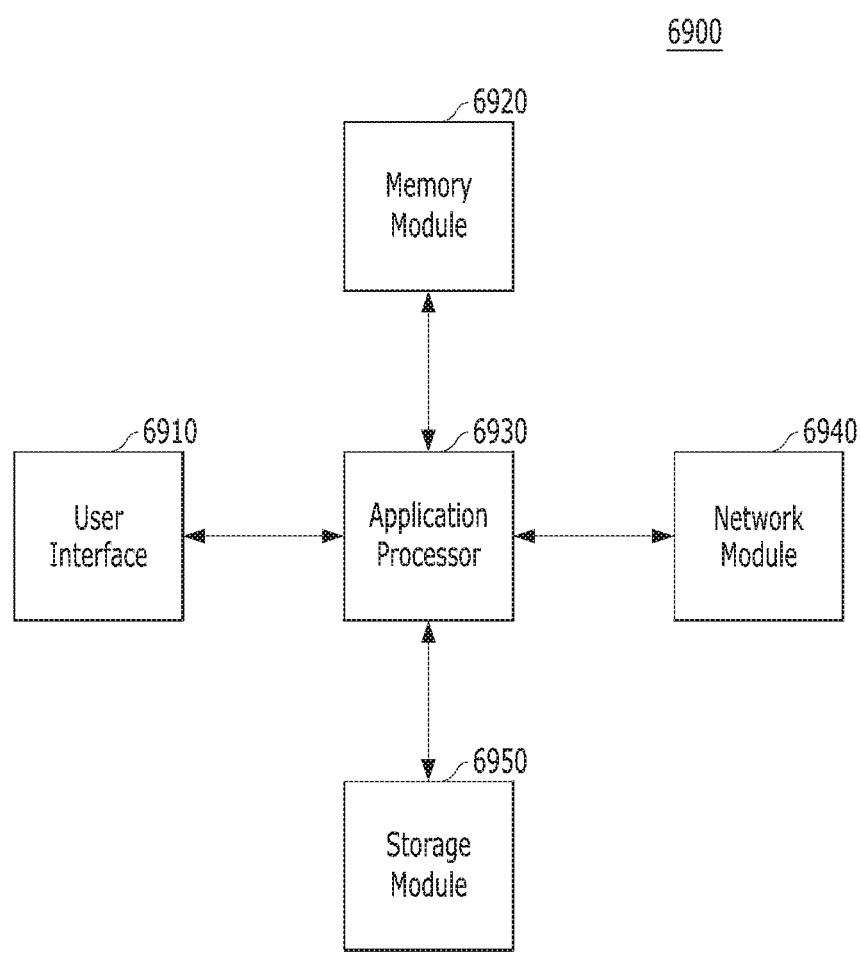

FIG. 23 is a diagram schematically illustrating another example of the data processing system including the memory system in accordance with an embodiment of the disclosure. FIG. 23 is a diagram schematically illustrating a user system to which the memory system is applied.

Referring to FIG. 23, the user system 6900 may include an application processor 6930, a memory module 6920, a network module 6940, a storage module 6950 and a user interface 6910.

Specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory, or cache memory of the user system 6900. The memory module 6920 may include a volatile RAM such as DRAM, SDRAM, DDR SDRAM, DDR2 SDRAM, DDR3 SDRAM, LPDDR SDARM, LPDDR2 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the disclosure, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIGS. 1 and 5. Furthermore, the storage module 6950 may be embodied as an SSD, an eMMC and an UFS as described above with reference to FIGS. 15 to 20.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a monitor.

Furthermore, when the memory system 110 of FIGS. 1 and 5 is applied to a mobile electronic device of the user system 6900, the application processor 6930 may control overall operations of the mobile electronic device. The network module 6940 may serve as a communication module for controlling wired/wireless communication with an external device. The user interface 6910 may display data processed by the application processor 6930 on a display/touch module of the mobile electronic device. Further, the user interface 6910 may support a function of receiving data from the touch panel.

As described above, in an embodiment of the disclosure, a memory system, a data processing system, and a method for verifying an operation method and an operation thereof does not have to track or manage a data pattern, or a write data as a table or a list, which are used for verifying an operation performed in the memory device.

In order to verify an operation of the memory system, since the read data outputted from the memory area through the data reading is compared with estimated read data generated based on arranged write command data, a verification procedure can be performed anytime without a record or a history of programming operation by comparing the read data and the estimated read data generated based on the arranged write command data.

While the disclosure illustrates and describes specific embodiments, it will be apparent to those skilled in the art in light of the present disclosure that various changes and modifications may be made without departing from the spirit and scope of the invention as defined in the following claims.

What is claimed is:

1. An operation method for a memory system including at least one memory device and a controller handling an operation in the at least one memory device, the operation method comprising:
    performing plural write operations with plural write command data to a first region of the at least one memory device in response to a first write command set;
    outputting read data read from the first region programmed in response to the first write command set;
    arranging the plural write command data based on an index of the plural write command data;
    generating estimated read data based on arranged write command data; and
    comparing the read data with the estimated read data to verify whether the plural write operations corresponding to the first write command set are successfully completed.

2. The operation method according to claim 1,
    wherein each of the plural write command data corresponds to each of the plural write operations, and
    wherein each of the plural write command data includes a first information item indicating an execution sequence of the write command and a second information item indicating which write command set the write command data is included in.

3. The operation method according to claim 1, wherein the read data includes plural data units, each stored in a space unit of the first region corresponding to a logical block address.

4. The operation method according to claim 3, wherein each of the plural data units includes:
a first field including the write command data;
a second field including the index;
a third field indicating a current reference of the read data; and
a fourth field indicating a storage range of the index, the storage range being defined by information of a start location and an end location of the storage range,
wherein the third field and the fourth field include one or more logical block addresses.

5. The operation method according to claim 1,
wherein the first region includes plural pages, and
wherein the plural pages are located in at least one block, at least one plane, or at least one die.

6. The operation method according to claim 1, wherein the arranging includes:
recognizing at least some of the plural write command data and locations corresponding to the at least some write command data within the first region; and
sorting the at least some of the plural write command data based on the index.

7. The operation method according to claim 6, wherein the generating includes:
extracting a most recent write command data from the at least some write command data for each logical block address of the first region corresponding to the operation result of the first write command set in the first region; and
aligning the extracted write command data according to a sequence of each logical block address of the first region to generate the estimated read data.

8. The operation method according to claim 1,
wherein the read data and the estimated read data have an identical length, and
wherein the length of the read data and the estimated read data is determined based on a number of the plural write command data, included in the first write command set, and a size of the first region.

9. The operation method according to claim 8, wherein the length is lesser than, or equal to, a number of bits in a page, and larger than, or equal to, a value which is a binarization value of the number of write command data, included in the first write command set, multiplied by a number of logical block addresses corresponding to the first region.

10. The operation method according to claim 1, wherein the operation method is performed in an idle state of the memory system for self-diagnosis.

11. A test device which is electrically coupled with at least one memory device in a memory system and engaged with, or included in, a controller handling an operation in the at least one memory device, the test device is configured to cause the memory system to:
perform plural write operations with plural write command data to a first region of the at least one memory device in response to a first write command set;
output read data read from the first region programmed in response to the first write command set;
arrange the plural write command data based on an index of the plural write command data;
generate estimated read data based on arranged write command data; and
compare the read data with the estimated read data to verify whether the plural write operations corresponding to the first write command set are successfully completed.

12. The test device according to claim 11,
wherein each of write the plural command data corresponds to each of the plural write operations, and
wherein each of the plural write command data includes a first information item indicating an execution sequence of the write command and a second information item indicating which write command set the write command data is included in.

13. The test device according to claim 11, wherein the read data includes plural data units, each stored in a space unit of the first region corresponding to a logical block address.

14. The test device according to claim 11, wherein each of the plural data units includes:
a first field including the write command data;
a second field including the index;
a third field indicating a current reference of the read data; and
a fourth field indicating a storage range of the index, the storage range being defined by a start location and an end location of the storage range,
wherein the third field and the fourth field include one or more logical block addresses.

15. The test device according to claim 11,
wherein the first region includes plural pages, and
wherein the plural pages are located in at least one block, at least one plane, or at least one die.

16. The test device according to claim 11, wherein the test device is further configured to cause the memory system to:
recognize at least some of the plural write command data and locations corresponding to the at least some write command data within the first region; and
sort the at least some of the plural write command data based on the index.

17. The test device according to claim 16, wherein the test device is further configured to cause the memory system to:
extract a most recent write command data from the at least some write command data for each logical block address of the first region corresponding to the operation result of the first write command set in the first region; and
aligning the extracted write command data according to a sequence of logical address to generate the estimated read data.

18. The test device according to claim 11,
wherein the read data and the estimated read data have an identical length, and
wherein the length of the read data and the estimated read data is determined based on a number of the plural write command data, included in the first write command set, and a size of the first region.

* * * * *